(12) United States Patent
Fox et al.

(10) Patent No.: US 7,939,443 B2
(45) Date of Patent: May 10, 2011

(54) METHODS FOR MULTI-WIRE ROUTING AND APPARATUS IMPLEMENTING SAME

(75) Inventors: Daryl Fox, Campbell, CA (US); Scott T. Becker, Scotts Valley, CA (US)

(73) Assignee: Tela Innovations, Inc., Los Gatos, CA (US)

( * ) Notice: Subject to any disclaimer, the term of this patent is extended or adjusted under 35 U.S.C. 154(b) by 300 days.

(21) Appl. No.: 12/411,249

(22) Filed: Mar. 25, 2009

(65) Prior Publication Data
US 2009/0224408 A1      Sep. 10, 2009

Related U.S. Application Data

(60) Provisional application No. 61/040,129, filed on Mar. 27, 2008.

(51) Int. Cl.
*H01L 21/44* (2006.01)
(52) U.S. Cl. .................. 438/599; 257/E21.575
(58) Field of Classification Search .............. 438/588, 438/599, 926
See application file for complete search history.

(56) References Cited

U.S. PATENT DOCUMENTS

| | | |
|---|---|---|
| 4,197,555 A | 4/1980 | Uehara et al. |
| 4,417,161 A | 11/1983 | Uya |
| 4,424,460 A | 1/1984 | Best |
| 4,682,202 A | 7/1987 | Tanizawa |
| 5,121,186 A | 6/1992 | Wong et al. |
| 5,208,765 A | 5/1993 | Turnbull |
| 5,224,057 A | 6/1993 | Igarashi |
| 5,378,649 A | 1/1995 | Huang |
| 5,471,403 A | 11/1995 | Fujimaga |
| 5,497,334 A | 3/1996 | Russell et al. |
| 5,497,337 A | 3/1996 | Ponnapalli et al. |
| 5,581,098 A | 12/1996 | Chang |
| 5,682,323 A | 10/1997 | Pasch et al. |
| 5,684,733 A | 11/1997 | Wu et al. |

(Continued)

FOREIGN PATENT DOCUMENTS

EP      1394858      3/2004

(Continued)

OTHER PUBLICATIONS

U.S. Appl. No. 60/625,342, filed May 25, 2006, Pileggi et al.

(Continued)

*Primary Examiner* — Chandra Chaudhari
(74) *Attorney, Agent, or Firm* — Martine Penilla & Gencarella, LLP

(57) ABSTRACT

A rectangular interlevel connector array (RICA) is defined in a semiconductor chip. To define the RICA, a virtual grid for interlevel connector placement is defined to include a first set of parallel virtual lines that extend across the layout in a first direction, and a second set of parallel virtual lines that extend across the layout in a second direction perpendicular to the first direction. A first plurality of interlevel connector structures are placed at respective gridpoints in the virtual grid to form a first RICA. The first plurality of interlevel connector structures of the first RICA are placed to collaboratively connect a first conductor channel in a first chip level with a second conductor channel in a second chip level. A second RICA can be interleaved with the first RICA to collaboratively connect third and fourth conductor channels that are respectively interleaved with the first and second conductor channels.

28 Claims, 25 Drawing Sheets

U.S. PATENT DOCUMENTS

| | | | |
|---|---|---|---|
| 5,705,301 A | 1/1998 | Garza et al. | |
| 5,790,417 A | 8/1998 | Chao et al. | |
| 5,796,624 A | 8/1998 | Sridhar et al. | |
| 5,825,203 A | 10/1998 | Kusunoki et al. | |
| 5,838,594 A | 11/1998 | Kojima | |
| 5,841,663 A | 11/1998 | Sharma et al. | |
| 5,847,421 A | 12/1998 | Yamaguchi | |
| 5,858,580 A | 1/1999 | Wang et al. | |
| 5,898,194 A | 4/1999 | Gheewala | |
| 5,900,340 A | 5/1999 | Reich et al. | |
| 5,908,827 A | 6/1999 | Sirna | |
| 5,923,059 A | 7/1999 | Gheewala | |
| 5,935,763 A | 8/1999 | Caterer et al. | |
| 5,973,507 A | 10/1999 | Yamazaki | |
| 5,977,305 A | 11/1999 | Wigler et al. | |
| 6,009,251 A | 12/1999 | Ho et al. | |
| 6,037,617 A | 3/2000 | Kumagai | |
| 6,044,007 A | 3/2000 | Capodieci | |
| 6,063,132 A | 5/2000 | DeCamp et al. | |
| 6,091,845 A | 7/2000 | Pierrat et al. | |
| 6,099,584 A | 8/2000 | Arnold et al. | |
| 6,100,025 A | 8/2000 | Wigler et al. | |
| 6,166,415 A * | 12/2000 | Sakemi et al. | 257/372 |
| 6,174,742 B1 | 1/2001 | Sudhindranath et al. | |
| 6,182,272 B1 | 1/2001 | Andreev et al. | |
| 6,194,104 B1 | 2/2001 | Hsu | |
| 6,194,252 B1 | 2/2001 | Yamaguchi | |
| 6,194,912 B1 | 2/2001 | Or-Bach | |
| 6,209,123 B1 | 3/2001 | Maziasz et al. | |
| 6,230,299 B1 | 5/2001 | McSherry et al. | |
| 6,232,173 B1 | 5/2001 | Hsu et al. | |
| 6,240,542 B1 | 5/2001 | Kapur | |
| 6,255,600 B1 | 7/2001 | Schaper | |
| 6,262,487 B1 | 7/2001 | Igarashi et al. | |
| 6,269,472 B1 | 7/2001 | Garza et al. | |
| 6,275,973 B1 | 8/2001 | Wein | |
| 6,282,696 B1 | 8/2001 | Garza et al. | |
| 6,331,733 B1 | 12/2001 | Or-Bach et al. | |
| 6,335,250 B1 | 1/2002 | Egi | |
| 6,338,972 B1 | 1/2002 | Sudhindranath et al. | |
| 6,356,112 B1 | 3/2002 | Tran et al. | |
| 6,370,679 B1 | 4/2002 | Chang et al. | |
| 6,378,110 B1 | 4/2002 | Ho | |
| 6,388,296 B1 | 5/2002 | Hsu | |
| 6,393,601 B1 | 5/2002 | Tanaka et al. | |
| 6,415,421 B2 | 7/2002 | Anderson et al. | |
| 6,416,907 B1 | 7/2002 | Winder et al. | |
| 6,421,820 B1 | 7/2002 | Mansfield et al. | |
| 6,425,112 B1 | 7/2002 | Bula et al. | |
| 6,425,117 B1 | 7/2002 | Pasch et al. | |
| 6,426,269 B1 | 7/2002 | Haffner et al. | |
| 6,436,805 B1 | 8/2002 | Trivedi | |
| 6,470,489 B1 | 10/2002 | Chang et al. | |
| 6,476,493 B2 | 11/2002 | Or-Bach et al. | |
| 6,477,695 B1 | 11/2002 | Gandhi | |
| 6,480,989 B2 | 11/2002 | Chan et al. | |
| 6,492,066 B1 | 12/2002 | Capodieci et al. | |
| 6,496,965 B1 | 12/2002 | van Ginneken et al. | |
| 6,505,327 B2 | 1/2003 | Lin | |
| 6,505,328 B1 | 1/2003 | Van Ginneken et al. | |
| 6,509,952 B1 | 1/2003 | Govil et al. | |
| 6,514,849 B1 | 2/2003 | Hui et al. | |
| 6,516,459 B1 | 2/2003 | Sahouria | |
| 6,523,156 B2 | 2/2003 | Cirit | |
| 6,525,350 B1 | 2/2003 | Kinoshita et al. | |
| 6,536,028 B1 | 3/2003 | Katsioulas et al. | |
| 6,553,544 B2 | 4/2003 | Tanaka et al. | |
| 6,553,559 B2 | 4/2003 | Liebmann et al. | |
| 6,571,140 B1 | 5/2003 | Wewalaarachchi | |
| 6,571,379 B2 | 5/2003 | Takayama | |
| 6,578,190 B2 | 6/2003 | Ferguson et al. | |
| 6,588,005 B1 * | 7/2003 | Kobayashi et al. | 716/55 |
| 6,590,289 B2 | 7/2003 | Shively | |
| 6,591,207 B2 | 7/2003 | Naya et al. | |
| 6,609,235 B2 | 8/2003 | Ramaswamy et al. | |
| 6,610,607 B1 | 8/2003 | Armbrust et al. | |
| 6,620,561 B2 | 9/2003 | Winder et al. | |
| 6,633,182 B2 | 10/2003 | Pileggi et al. | |
| 6,643,831 B2 | 11/2003 | Chang et al. | |
| 6,661,041 B2 | 12/2003 | Keeth | |
| 6,673,638 B1 | 1/2004 | Bendik et al. | |
| 6,687,895 B2 | 2/2004 | Zhang | |
| 6,691,297 B1 | 2/2004 | Misaka et al. | |
| 6,714,903 B1 | 3/2004 | Chu et al. | |
| 6,732,338 B2 | 5/2004 | Crouse et al. | |
| 6,737,199 B1 | 5/2004 | Hsieh | |
| 6,737,347 B1 | 5/2004 | Houston et al. | |
| 6,745,372 B2 | 6/2004 | Cote et al. | |
| 6,749,972 B2 | 6/2004 | Yu | |
| 6,760,269 B2 | 7/2004 | Nakase et al. | |
| 6,765,245 B2 | 7/2004 | Bansal | |
| 6,777,138 B2 | 8/2004 | Pierrat et al. | |
| 6,777,146 B1 | 8/2004 | Samuels | |
| 6,789,246 B1 | 9/2004 | Mohan et al. | |
| 6,792,593 B2 | 9/2004 | Takashima et al. | |
| 6,794,914 B2 | 9/2004 | Sani et al. | |
| 6,795,952 B1 | 9/2004 | Stine et al. | |
| 6,795,953 B2 | 9/2004 | Bakarian et al. | |
| 6,807,663 B2 | 10/2004 | Cote et al. | |
| 6,819,136 B2 | 11/2004 | Or-Bach | |
| 6,826,738 B2 | 11/2004 | Cadouri | |
| 6,834,375 B1 | 12/2004 | Stine et al. | |
| 6,841,880 B2 | 1/2005 | Matsumoto et al. | |
| 6,850,854 B2 | 2/2005 | Naya et al. | |
| 6,854,096 B2 | 2/2005 | Eaton et al. | |
| 6,854,100 B1 | 2/2005 | Chuang et al. | |
| 6,877,144 B1 | 4/2005 | Rittman et al. | |
| 6,884,712 B2 | 4/2005 | Yelehanka et al. | |
| 6,898,770 B2 | 5/2005 | Boluki et al. | |
| 6,904,582 B1 | 6/2005 | Rittman et al. | |
| 6,918,104 B2 | 7/2005 | Pierrat et al. | |
| 6,928,635 B2 | 8/2005 | Pramanik et al. | |
| 6,931,617 B2 | 8/2005 | Sanie et al. | |
| 6,953,956 B2 | 10/2005 | Or-Bach et al. | |
| 6,954,918 B2 | 10/2005 | Houston | |
| 6,957,402 B2 | 10/2005 | Templeton et al. | |
| 6,968,527 B2 | 11/2005 | Pierrat | |
| 6,978,436 B2 | 12/2005 | Cote et al. | |
| 6,978,437 B1 | 12/2005 | Rittman et al. | |
| 6,992,925 B2 | 1/2006 | Peng | |
| 6,993,741 B2 | 1/2006 | Liebmann et al. | |
| 7,028,285 B2 | 4/2006 | Cote et al. | |
| 7,041,568 B2 | 5/2006 | Goldbach et al. | |
| 7,052,972 B2 | 5/2006 | Sandhu et al. | |
| 7,063,920 B2 | 6/2006 | Baba-Ali | |
| 7,064,068 B2 | 6/2006 | Chou et al. | |
| 7,065,731 B2 | 6/2006 | Jacques et al. | |
| 7,079,989 B2 | 7/2006 | Wimer | |
| 7,093,208 B2 | 8/2006 | Williams et al. | |
| 7,093,228 B2 | 8/2006 | Andreev et al. | |
| 7,103,870 B2 | 9/2006 | Misaka et al. | |
| 7,105,871 B2 | 9/2006 | Or-Bach et al. | |
| 7,107,551 B1 | 9/2006 | de Dood et al. | |
| 7,120,882 B2 | 10/2006 | Kotani et al. | |
| 7,124,386 B2 | 10/2006 | Smith et al. | |
| 7,132,203 B2 | 11/2006 | Pierrat | |
| 7,137,092 B2 | 11/2006 | Maeda | |
| 7,149,999 B2 | 12/2006 | Kahng et al. | |
| 7,152,215 B2 | 12/2006 | Smith et al. | |
| 7,155,685 B2 | 12/2006 | Mori et al. | |
| 7,155,689 B2 | 12/2006 | Pierrat et al. | |
| 7,159,197 B2 | 1/2007 | Falbo et al. | |
| 7,174,520 B2 | 2/2007 | White et al. | |
| 7,175,940 B2 | 2/2007 | Laidig et al. | |
| 7,185,294 B2 | 2/2007 | Zhang | |
| 7,194,712 B2 | 3/2007 | Wu | |
| 7,219,326 B2 | 5/2007 | Reed et al. | |
| 7,225,423 B2 | 5/2007 | Bhattacharya et al. | |
| 7,227,183 B2 | 6/2007 | Donze et al. | |
| 7,231,628 B2 | 6/2007 | Pack et al. | |
| 7,252,909 B2 | 8/2007 | Shin et al. | |
| 7,264,990 B2 | 9/2007 | Rueckes et al. | |
| 7,278,118 B2 | 10/2007 | Pileggi et al. | |
| 7,287,320 B2 | 10/2007 | Wang et al. | |
| 7,294,534 B2 | 11/2007 | Iwaki | |
| 7,302,651 B2 | 11/2007 | Allen et al. | |
| 7,335,966 B2 | 2/2008 | Ihme et al. | |

| | | |
|---|---|---|
| 7,338,896 B2 | 3/2008 | Vanhaelemeersch et al. |
| 7,350,183 B2 | 3/2008 | Cui et al. |
| 7,353,492 B2 | 4/2008 | Gupta et al. |
| 7,360,179 B2 | 4/2008 | Smith et al. |
| 7,360,198 B2 | 4/2008 | Rana et al. |
| 7,366,997 B1 | 4/2008 | Rahmat et al. |
| 7,367,008 B2 | 4/2008 | White et al. |
| 7,383,521 B2 | 6/2008 | Smith et al. |
| 7,400,627 B2 | 7/2008 | Wu et al. |
| 7,404,173 B2 | 7/2008 | Wu et al. |
| 7,421,678 B2 | 9/2008 | Barnes et al. |
| 7,423,298 B2 | 9/2008 | Mariyama et al. |
| 7,424,694 B2 | 9/2008 | Ikeda |
| 7,426,710 B2 | 9/2008 | Zhang et al. |
| 7,434,185 B2 | 10/2008 | Dooling et al. |
| 7,441,211 B1 | 10/2008 | Gupta et al. |
| 7,444,609 B2 | 10/2008 | Charlebois et al. |
| 7,446,352 B2 | 11/2008 | Becker et al. |
| 7,449,371 B2 | 11/2008 | Kemerling et al. |
| 7,458,045 B2 | 11/2008 | Cote et al. |
| 7,465,973 B2 | 12/2008 | Chang et al. |
| 7,466,607 B2 | 12/2008 | Hollis et al. |
| 7,480,880 B2 | 1/2009 | Visweswariah et al. |
| 7,484,197 B2 | 1/2009 | Allen et al. |
| 7,487,475 B1 | 2/2009 | Kriplani et al. |
| 7,506,300 B2 | 3/2009 | Sezginer et al. |
| 7,509,621 B2 | 3/2009 | Melvin, III |
| 7,509,622 B2 | 3/2009 | Sinha et al. |
| 7,514,959 B2 | 4/2009 | Or-Bach et al. |
| 7,523,429 B2 | 4/2009 | Kroyan et al. |
| 7,563,701 B2 | 7/2009 | Chang et al. |
| 7,665,051 B2 | 2/2010 | Ludwig et al. |
| 7,770,144 B2 | 8/2010 | Dellinger |
| 2003/0042930 A1 | 3/2003 | Pileggi et al. |
| 2003/0061592 A1 | 3/2003 | Agrawal et al. |
| 2003/0088842 A1 | 5/2003 | Cirit |
| 2003/0229875 A1 | 12/2003 | Smith et al. |
| 2004/0049754 A1 | 3/2004 | Liao et al. |
| 2004/0145028 A1 | 7/2004 | Matsumoto et al. |
| 2004/0153979 A1 | 8/2004 | Chang |
| 2004/0161878 A1 | 8/2004 | Or-Bach et al. |
| 2004/0243966 A1 | 12/2004 | Dellinger |
| 2005/0055828 A1 | 3/2005 | Wang et al. |
| 2005/0087806 A1 | 4/2005 | Hokazono |
| 2005/0101112 A1 | 5/2005 | Rueckes et al. |
| 2005/0136340 A1 | 6/2005 | Baselmans et al. |
| 2005/0189614 A1 | 9/2005 | Ihme et al. |
| 2005/0224982 A1 | 10/2005 | Kemerling et al. |
| 2005/0229130 A1 | 10/2005 | Wu et al. |
| 2005/0251771 A1 | 11/2005 | Robles |
| 2005/0268256 A1 | 12/2005 | Tsai et al. |
| 2006/0084261 A1 | 4/2006 | Iwaki |
| 2006/0101370 A1 | 5/2006 | Cui et al. |
| 2006/0112355 A1 | 5/2006 | Pileggi et al. |
| 2006/0121715 A1 | 6/2006 | Chang et al. |
| 2006/0125024 A1 | 6/2006 | Ishigaki |
| 2006/0151810 A1 | 7/2006 | Ohshige |
| 2006/0181310 A1 | 8/2006 | Rhee |
| 2006/0197557 A1 | 9/2006 | Chung |
| 2006/0206854 A1 | 9/2006 | Barnes et al. |
| 2006/0223302 A1 | 10/2006 | Chang et al. |
| 2007/0038973 A1 | 2/2007 | Li et al. |
| 2007/0074145 A1 | 3/2007 | Tanaka |
| 2007/0101305 A1 | 5/2007 | Smith et al. |
| 2007/0106971 A1 | 5/2007 | Lien et al. |
| 2007/0113216 A1 | 5/2007 | Zhang |
| 2007/0209029 A1 | 9/2007 | Ivonin et al. |
| 2007/0234252 A1 | 10/2007 | Visweswariah et al. |
| 2007/0256039 A1 | 11/2007 | White |
| 2007/0274140 A1 | 11/2007 | Joshi et al. |
| 2008/0005712 A1 | 1/2008 | Charlebois et al. |
| 2008/0046846 A1 | 2/2008 | Chew et al. |
| 2008/0098334 A1 | 4/2008 | Pileggi et al. |
| 2008/0127029 A1 | 5/2008 | Graur et al. |
| 2008/0144361 A1 | 6/2008 | Wong |
| 2008/0148216 A1 | 6/2008 | Chan et al. |
| 2008/0163141 A1 | 7/2008 | Scheffer et al. |
| 2008/0168406 A1 | 7/2008 | Rahmat et al. |
| 2008/0276105 A1 | 11/2008 | Hoberman et al. |
| 2009/0024974 A1 | 1/2009 | Yamada |
| 2009/0077524 A1 | 3/2009 | Nagamura |
| 2009/0106714 A1 | 4/2009 | Culp et al. |
| 2009/0228853 A1 | 9/2009 | Hong et al. |
| 2010/0006900 A1 | 1/2010 | Becker et al. |
| 2010/0006986 A1 | 1/2010 | Becker et al. |
| 2010/0011331 A1 | 1/2010 | Becker et al. |
| 2010/0019308 A1 | 1/2010 | Chan et al. |
| 2010/0023907 A1 | 1/2010 | Becker et al. |

FOREIGN PATENT DOCUMENTS

| | | |
|---|---|---|
| EP | 1670062 | 6/2006 |
| FR | 2860920 | 4/2005 |
| JP | 10-116911 | 5/1998 |
| JP | 2002-258463 | 9/2002 |
| JP | 2005-259913 | 9/2005 |
| KR | 10-1999-0057943 A | 7/1999 |
| KR | 10-2000-0028830 A | 5/2000 |
| KR | 10-2005-0030347 A | 3/2005 |
| WO | WO 2005/104356 | 11/2005 |
| WO | WO 2006/014849 | 2/2006 |
| WO | WO 2006/052738 | 5/2006 |

OTHER PUBLICATIONS

Acar, et al., "A Linear-Centric Simulation Framework for Parametric Fluctuations", 2002, IEEE, Carnegie Mellon University USA, pp. 1-8.

Amazawa, et al., "Fully Planarized Four-Level Intercormection with Stacked VLAS Using CMP of Selective CVD-A1 and Insulator and its Application to Quarter Micron Gate Array LSIs", 1995, IEEE, Japan, pp. 473-476.

Axelrad et al. "Efficient Full-Chip Yield Analysis Methodology for OPC-Corrected VLSI Design", 2000, International Symposium on Quality Electronic Design (ISQED).

Balasinski et al. "Impact of Subwavelength CD Tolerance on Device Performance", 2002, SPIE.

Burkhardt, et al., "Dark Field Double Dipole Lithography (DDL) for Back-End-Of-Line Processes", 2007, SPIE Proceeding Series, vol. 6520; 65200K.

Capetti, et al., "Sub k1= 25 Lithography with Double Patterning Technique for 45nm Technology Node Flash Memory Devices at $\lambda$ = 193nm", 2007, SPIE Proceeding Series, vol. 6520; 65202K.

Chandra, et al., "An Interconnect Channel Design Methodology for High Performance Integrated Circuits", 2004, IEEE, Carnegie Mellon University, pp. 1-6.

Cheng, et al., "Feasibility Study of Splitting Pitch Technology on 45nm Contact Patterning with 0.93 NA", 2007, SPIE Proceeding Series, vol. 6520; 65202N.

Chow, et al., "The Design of a SRAM-Based Field-Programmable Gate Array—Part II: Circuit Design and Layout", 1999, IEEE, vol. 7 # 3 pp. 321-330.

Clark et al. "Managing Standby and Active Mode Leakage Power in Deep Sub-Micron Design", Aug. 9-11, 2004, ACM.

Cobb et al. "Using OPC to Optimize for Image Slope and Improve Process Window", 2003, SPIE.

Devgan "Leakage Issues in IC Design: Part 3", 2003, CCAD.

DeVor, et al., "Statistical Quality Design and Control", 1992, Macmillan Publishing Company, pp. 264-267.

Dusa, et al. "Pitch Doubling Through Dual Patterning Lithography Challenges in Integration and Litho Budgets", 2007, SPIE Proceeding Series, vol. 6520; 65200G.

El-Gamal, "Fast, Cheap and Under Control: The Next Implementation Fabric", Jun. 2-6, 2003, ACM Press, pp. 354-355.

Frankel, "Quantum State Control Interference Lithography and Trim Double Patterning for 32-16nm Lithography", 2007, SPIE Proceeding Series, vol. 6520; 65202L.

Garg, et al. "Lithography Driven Layout Design", 2005, IEEE.

Grobman et al. "Reticle Enhancement Technology Trends: Resource and Manufacturability Implications for the Implementation of Physical Designs" Apr. 1-4, 2001, ACM.

Grobman et al. "Reticle Enhancement Technology: Implications and Challenges for Physical Design" Jun. 18-22, 2001, ACM.

Gupta et al. "Enhanced Resist and Etch CD Control by Design Perturbation", Oct. 4-7, 2006, Society of Photo-Optical Instrumentation Engineers.

Gupta et al. "A Practical Transistor-Level Dual Threshold Voltage Assignment Methodology", 2005, Sixth International Symposium on Quality Electronic Design (ISQED).

Gupta et al. "Detailed Placement for Improved Depth of Focus and CD Control", 2005, ACM.

Gupta et al. "Joining the Design and Mask Flows for Better and Cheaper Masks", Oct. 14-17, 2004, Society of Photo-Optical Instrumentation Engineers.

Gupta et al. "Selective Gate-Length Biasing for Cost-Effective Runtime Leakage Control", Jun. 7-11, 2004, ACM.

Gupta et al. "Wafer Topography-Aware Optical Proximity Correction for Better DOF Margin and CD Control", Apr. 13-15, 2005, SPIE.

Hayashida, et al., "Manufacturable Local Interconnect technology Fully Compatible with Titanium Salicide Process", Jun. 11-12, 1991, VMIC Conference.

Heng, et al., "A VLSI Artwork Legalization Technique Base on a New Criterion of Minimum Layout Perturbation", 1997, ACM Press, pp. 116-121.

Heng, et al., "Toward Through-Process Layout Quality Metrics", Mar. 3-4, 2005, Society of Photo-Optical Instrumentation Engineers.

Hu, et al., "Synthesis and Placement Flow for Gain-Based Programmable Regular Fabrics", Apr. 6-9, 2003, ACM Press, pp. 197-203.

Hutton, et al., "A Methodology for FPGA to Structured-ASIC Synthesis and Verification", 2006, EDAA, pp. 64-69.

Intel Core Microarchitecture White Paper "Introducing the 45 nm Next-Generation Intel Core Microarchitecture," 2007, Intel Corporation.

Jayakumar, et al., "A Metal and VIA Maskset Programmable VLSI Design Methodology using PLAs", 2004, IEEE, pp. 590-594.

Jhaveri, T. et al., Maximization of Layout Printability/Manufacturability by Extreme Layout Regularity, Proc. of the SPIE, Apr. 2006.

Kang, S.M., Metal-Metal Matrix (M3) for High-Speed MOS VLSI Layout, IEEE Trans. on CAD, vol. CAD-6, No. 5, Sep. 1987.

Kheterpal, et al., "Design Methodology for Manufacturability Based on Regular Logic-Bricks", DAC, Jun. 13-17, 2005, IEEE/AMC, vol. 6520.

Kheterpal, et al., "Routing Architecture Exploration for Regular Fabrics", DAC, Jun. 7-11, 2004, ACM Press, pp. 204-207.

Kim, et al., "Double Exposure Using 193nm Negative Tone Photoresist", 2007, SPIE Proceeding Series, vol. 6520; 65202M.

Kim, et al., "Issues and Challenges of Double Patterning Lithography in DRAM", 2007, SPIE Proceeding Series, vol. 6520; 65200H.

Koorapaty, et al., "Exploring Logic Block Granularity for Regular Fabrics", 2004, IEEE, pp. 1-6.

Koorapaty, et al., "Heterogeneous Logic Block Architectures for Via-Patterned Programmable Fabric", 13th International Conference on Field Programmable Logic and Applications (FPL) 2003, Lecture Notes in Computer Science (LNCS), Sep. 2003, Springer-Verlag, vol. 2778, pp. 426-436.

Koorapaty, et al., "Modular, Fabric-Specific Synthesis for Programmable Architectures", 12th International Conference on Field Programmable Logic and Applications (FPL_2002, Lecture Notes in Computer Science (LNCS)), Sep. 2002, Springer-Verlag, vol. 2438 pp. 132-141.

Lavin et al. "Backend DAC Flows for "Restrictive Design Rules"", 2004, IEEE.

Li, et al., "A Linear-Centric Modeling Approach to Harmonic Balance Analysis", 2002, IEEE, pp. 1-6.

Li, et al., "Nonlinear Distortion Analysis Via Linear-Centric Models", 2003, IEEE, pp. 897-903.

Liebmann et al., "Integrating DFM Components Into a Cohesive Design-To-Silicon Solution", IBM Systems and Technology Group, b IBM Research, pp. 1-12.

Liebmann, et al., "High-Perfoimance Circuit Design for the RET-Enabled 65nm Technology Node", Feb. 26-27, 2004, SPIE Proceeding Series, vol. 5379 pp. 20-29.

Liebmann, L. W., Layout Impact of Resolution Enhancement Techniques: Impediment or Opportunity?, International Symposium on Physical Design, 2003.

Liu, et al., "Double Patterning with Multilayer Hard Mask Shrinkage for Sub-0.25 k1 Lithography", 200, SPIE Proceeding Series, vol. 6520; 65202J , 2007.

Miller, "Manufacturing-Aware Design Helps Boost IC Yield", Sep. 9, 2004, http://www.ectimcs.com/showArticle.jhtml?articleID=47102054.

Mo, et al., "Checkerboard: A Regular Structure and its Synthesis, International Workshop on Logic and Synthesis", 2003, Department of Electrical Engineering and Computer Sciences, UC Berkeley, California, pp. 1-7.

Mo, et al., "PLA-Based Regular Structures and Their Synthesis", 2003, Department of Electrical Engineering and Computer Sciences, IEEE, pp. 723-729.

Mo, et al., "Regular Fabrics in Deep Sub-Micron Integrated-Circuit Design", 2004, Kluwer Academic Publishers, Entire Book.

Moore, Samuel K., "Intel 45-nanometer Penryn Processors Arrive," Nov. 13, 2007, IEEE Spectrum, http://spectrum.ieee.org/semiconductors/design/intel-45nanometer-penryn-processors-arrive.

Mutoh et al. "1-V Power Supply High-Speed Digital Circuit Technology with Multithreshold-Voltage CMOS", 1995, IEEE.

Op de Beek, et al., "Manufacturability issues with Double Patterning for 50nm half pitch damascene applications, using RELACS® shrink and corresponding OPC", 2007, SPIE Proceeding Series, vol. 6520; 65200I.

Or-Bach, "Programmable Circuit Fabrics", Sep. 18, 2001, e-ASIC, pp. 1-36.

Otten, et al., "Planning for Performance", DAC 1998, ACM Inc., pp. 122-127.

Pack et al. "Physical & Timing Verification of Subwavelength-Scale Designs-Part I: Lithography Impact on MOSFETs", 2003, SPIE.

Pandini, et al., "Congestion-Aware Logic Synthesis", 2002, IEEE, pp. 1-8.

Pandini, et al., "Understanding and Addressing the Impact of Wiring Congestion During Technology Mapping", ISPD Apr. 7-10, 2002, ACM Press, pp. 131-136.

Patel, et al., "An Architectural Exploration of Via Patterned Gate Arrays, ISPD 2003", Apr. 6, 2003, pp. 184-189.

Pileggi, et al., "Exploring Regular Fabrics to Optimize the Performance-Cost Trade-Offs, Proceedings of the 40th ACM/IEEE Design Automation Conference (DAC) 2003", Jun. 2003, ACM Press, pp. 782-787.

Poonawala, et al., "ILT for Double Exposure Lithography with Conventional and Novel Materials", 2007, SPIE Proceeding Series, vol. 6520; 65202Q.

Qian et al. "Advanced Physical Models for Mask Data Verification and Impacts on Physical Layout Synthesis" 2003. IEEE.

Ran, et al., "An Integrated Design Flow for a Via-Configurable Gate Array", 2004, IEEE, pp. 582-589.

Ran, et al., "Designing a Via-Configurable Regular Fabric", Custom Integrated Circuits Conference (CICC). Proceedings of the IEEE, Oct. 2004, Oct. 1, 2004, pp. 423-426.

Ran, et al., "On Designing Via-Configurable Cell Blocks for Regular Fabrics" Proceedings of the Design Automation Conference (DAC) 2004, Jun. 2004, ACM Press, s 198-203.

Ran, et al., "The Magic of a Via-Configurable Regular Fabric", Proceedings of the Tree International Conference on Computer Design (ICCD) Oct. 2004.

Ran, et al., "Via-Configurable Routing Architectures and Fast Design Mappability Estimation for Regular Fabrics", 2005, IEEE, pp. 25-32.

Reis, et al., "Physical Design Methodologies for Performance Predictability and Manufacturability", Apr. 14-16, 2004, ACM Press, pp. 390-397.

Robertson, et al., "The Modeling of Double Patterning Lithographic Processes", 2007, SPIE Proceeding Series, vol. 6520; 65200J.

Rovner, "Design for Manufacturability in Via Programmable Gate Arrays", May 2003, Graduate School of Carnegie Mellon University.

Sengupta, "An Integrated CAD Framework Linking VLSI Layout Editors and Process Simulators", 1998, Thesis for Rice University, pp. 1-101.

Sengupta, et al., "An Integrated CAD Framework Linking VLSI Layout Editors and Process Simulators", 1996, SPIE Proceeding Series, vol. 2726; pp. 244-252.

Sherlekar, "Design Considerations for Regular Fabrics", Apr. 18-21, 2004, ACM Press, pp. 97-102.

Sreedhar et al. "Statistical Yield Modeling for Sub-Wavelength Lithography", 2008, IEEE.

Stapper, "Modeling of Defects in Integrated Circuit Photolithographic Patterns", Jul. 1, 1984, IBM, vol. 28 # 4, pp. 461-475.

Taylor, et al., "Enabling Energy Efficiency in Via-Patterned Gate Array Devices", Jun. 7-11, 2004, ACM Press, pp. 874-877.

Tian et al. "Model-Based Dummy Feature Placement for Oxide Chemical_Mechanical Polishing Manufacturability" 2000, ACM.

Tong, et al., "Regular Logic Fabrics for a Via Patterned Gate Array (VPGA), Custom Integrated Circuits Conference", Sep. 2003, Proceedings of the IEEE, pp. 53-56.

Vanleenhove, et al., "A Litho-Only Approach to Double Patterning", 2007, SPIE Proceeding Series, vol. 6520; 65202F.

Wang, et al., "Performance Optimization for Gridded-Layout Standard Cells", 2004, vol. 5567 SPIE.

Wang, J. et al., Standard Cell Layout with Regular Contact Placement, IEEE Trans. on Semicon. Mfg., vol. 17, No. 3, Aug. 2004.

Webb, Clair, "Layout Rule Trends and Affect upon CPU Design", 2006, vol. 6156 SPIE.

Webb, Clair, "45nm Design for Manufacturing," Intel Technology Journal, vol. 12, Issue 02, Jun. 17, 2008, ISSN 1535-864X, pp. 121-130.

Wenren, et al., "The Improvement of Photolithographic Fidelity of Two-dimensional Structures Though Double Exposure Method", 2007, SPIE Proceeding Series, vol. 6520; 65202I.

Wilcox, et al., "Design for Manufacturability: A Key to Semiconductor Manufacturing Excellence", 1998, IEEE, pp. 308-313.

Wu, et al., "A Study of Process Window Capabilities for Two-dimensional Structures under Double Exposure Condition", 2007, SPIE Proceeding Series, vol. 6520; 65202O.

Xiong, et al., "The Constrained Via Minimization Problem for PCB and VLSI Design", 1988, ACM PRESS/IEEE, pp. 573-578.

Yamamaoto, et al., "New Double Exposure Technique without Alternating Phase Shift Mask", 2007, SPIE Proceeding Series, vol. 6520; 652052P.

Yang, et al., "Interconnection Driven VLSI Module Placement Based on Quadratic Programming and Considering Congestion Using LFF Principles", 2004, IEEE, pp. 1243-1247.

Yao, et al., "Multilevel Routing With Redundant Via Insertion", Oct. 2006, IEEE, pp. 1148-1152.

Zheng, et al."Modeling and Analysis of Regular Symmetrically Structured Power/Ground Distribution Networks", DAC, Jun. 10-14, 2002, ACM PRESS, pp. 395-398.

Zhu, et al., "A Stochastic Integral Equation Method for Modeling the Rough Surface Effect on Interconnect Capacitance", 2004, IEEE.

Zhu, et al., "A Study of Double Exposure Process Design with Balanced Performance Parameters for Line/Space Applications", 2007, SPIE Proceeding Series, vol. 6520; 65202H.

Zuchowski, et al., "A Hybrid ASIC and FPGA Architecture", 2003, IEEE, pp. 187-194.

* cited by examiner

METHODS FOR MULTI-WIRE ROUTING AND APPARATUS IMPLEMENTING SAME

CLAIM OF PRIORITY

This application claims priority under 35 U.S.C. 119(e) to U.S. Provisional Patent Application No. 61/040,129, filed Mar. 27, 2008, entitled "Methods for Multi-Wire Routing and Apparatus Implementing Same." The disclosure of the above-identified provisional patent application is incorporated herein by reference.

BACKGROUND

A push for higher performance and smaller die size drives the semiconductor industry to reduce circuit chip area by approximately 50% every two years. The chip area reduction provides an economic benefit for migrating to newer technologies. The 50% chip area reduction is achieved by reducing the feature sizes between 25% and 30%. The reduction in feature size is enabled by improvements in manufacturing equipment and materials. For example, improvement in the lithographic process has enabled smaller feature sizes to be achieved, while improvement in chemical mechanical polishing (CMP) has in-part enabled a higher number of interconnect layers.

In the evolution of lithography, as the minimum feature size approached the wavelength of the light source used to expose the feature shapes, unintended interactions occurred between neighboring features. Today minimum feature sizes are approaching 32 nm (nanometers), while the wavelength of the light source used in the photolithography process remains at 193 nm. The difference between the minimum feature size and the wavelength of light used in the photolithography process is defined as the lithographic gap. As the lithographic gap grows, the resolution capability of the lithographic process decreases.

An interference pattern occurs as each shape on the mask interacts with the light. The interference patterns from neighboring shapes can create constructive or destructive interference. In the case of constructive interference, unwanted shapes may be inadvertently created. In the case of destructive interference, desired shapes may be inadvertently removed. In either case, a particular shape is printed in a different manner than intended, possibly causing a device failure. Correction methodologies, such as optical proximity correction (OPC), attempt to predict the impact from neighboring shapes and modify the mask such that the printed shape is fabricated as desired. The quality of the light interaction prediction is declining as process geometries shrink and as the light interactions become more complex.

In view of the foregoing, techniques are sought for managing lithographic gap issues as technology continues to progress toward smaller semiconductor device features sizes.

SUMMARY

In one embodiment, a method is disclosed for defining a rectangular interlevel connector array (RICA) in a semiconductor chip layout. The method includes an operation for defining a virtual grid for interlevel connector placement. The virtual grid is defined by a first set of parallel virtual lines that extend across the layout in a first direction and by a second set of parallel virtual lines that extend across the layout in a second direction that is perpendicular to the first direction. Each intersection point between the first and second sets of parallel virtual lines is a gridpoint in the virtual grid. The method also includes an operation for placing a first plurality of interlevel connector structures at respective gridpoints in the virtual grid to form a first RICA. Neighboring interlevel connector structures of the first RICA are spaced apart from each other by a first number of gridpoints in the first direction and by a second number of gridpoints in the second direction. The first plurality of interlevel connector structures of the first RICA are placed to collaboratively connect a first conductor channel in a first chip level with a second conductor channel in a second chip level.

In another embodiment, a method is disclosed for wire routing in a semiconductor chip layout. The method includes an operation for defining a first conductor channel layout in a first chip level. The first conductor channel layout includes a first plurality of parallel wire layout shapes having a common electrical connectivity and oriented in a first direction. The method also includes an operation for defining a second conductor channel layout in a second chip level. The second conductor channel layout includes a second plurality of parallel wire layout shapes having a common electrical connectivity and oriented in a second direction that is perpendicular to the first direction. The first and second conductor channel layouts extend across each other within the chip layout at a crossing location. The method further includes an operation for defining a first RICA layout at the crossing location to connect the first conductor channel layout to the second conductor channel layout. The first RICA layout includes a first plurality of interlevel connector layout shapes placed to collaboratively connect the wire layout shapes of the first conductor channel layout to the wire layout shapes of the second conductor channel layout.

In another embodiment, a semiconductor chip is disclosed. The chip includes a first conductor channel defined in a first chip level. The first conductor channel includes a first plurality of parallel wires having a common electrical connectivity and oriented in a first direction. The chip also includes a second conductor channel defined in a second chip level. The second conductor channel includes a second plurality of parallel wires having a common electrical connectivity and oriented in a second direction that is perpendicular to the first direction. The first and second conductor channels extend across each other within the chip at a crossing location. The chip further includes a first RICA defined at the crossing location to connect the first conductor channel to the second conductor channel. The first RICA includes a first plurality of interlevel connectors placed to collaboratively connect the wires of the first conductor channel to the wires of the second conductor channel.

Other aspects and advantages of the invention will become more apparent from the following detailed description, taken in conjunction with the accompanying drawings, illustrating by way of example the present invention.

DETAILED DESCRIPTION

Figure 1A:
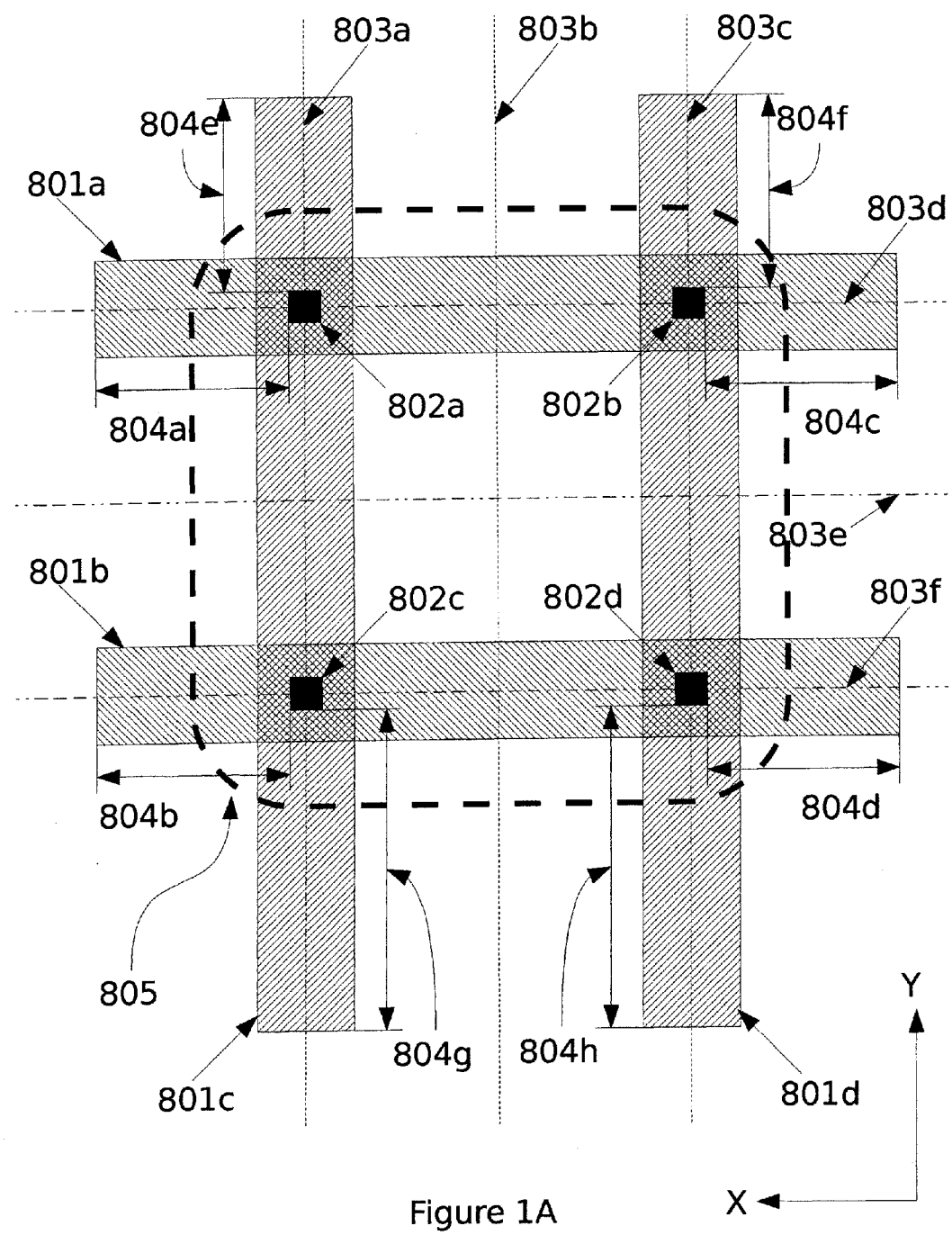
FIG. 1A is an illustration showing placement of wires and interlevel connectors, in accordance with one embodiment of the present invention.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Dynamic Array Architecture

In deep sub-micron VLSI (Very-Large-Scale Integration) design, process compensation techniques (PCTs) such as Optical Proximity Correction (OPC) or sub-resolution feature utilization, among others, enhance the printing of layout features. PCTs are easier to develop and implement when the layout is highly regular and when the quantity and diversity of lithographic interactions are minimized across the layout.

The dynamic array architecture represents a semiconductor device design paradigm capable of enhancing PCT development and implementation. In the dynamic array architecture, linear-shaped layout features are defined along a regular-spaced virtual grate (or regular-spaced virtual grid) in a number of levels of a cell, i.e., in a number of levels of a semiconductor chip. The virtual grate is defined by a set of equally spaced, parallel virtual lines extending across a given level in a given chip area. The virtual grid is defined by a first set of equally spaced, parallel virtual lines extending across a given level in a given chip area in a first direction, and by a second set of equally spaced, parallel virtual lines extending across the given level in the given chip area in a second direction, where the second direction is perpendicular to the first direction. In various embodiments, the virtual grate of a given level can be oriented either substantially perpendicular of substantially parallel to the virtual grate of an adjacent level.

A linear layout feature is defined as a layout shape that extends along a virtual line of a virtual grate without contacting a neighboring linear layout feature that extends along a different virtual line of the virtual grate. In one embodiment, a linear layout feature can be defined to have a substantially rectangular cross-section when viewed in an as-drawn state. In another embodiment, a linear layout feature can be defined to have a primarily rectangular cross-section defined by a width and length, with some allowable variation in width along its length. It should be understood, however, that in this embodiment, the linear layout feature of varying width may not contact a neighboring linear layout feature that extends along a different virtual line of the same virtual grate within the same chip level. For example, some linear layout features may have one or more variations in width at any number of locations along their length, wherein "width" is defined across the substrate in a direction perpendicular to the virtual line along which the linear layout feature is disposed. Such a variation in width may be used to define a contact head upon which a contact is to connect, or may serve some other purpose. Additionally, different linear layout features within a given chip level can be defined to have the same width or different widths, so long as the width variation is predictable from a manufacturing perspective and does not adversely impact the manufacture of the linear layout feature or its neighboring layout features.

In the dynamic array architecture, variations in a vertical cross-section shape of an as-fabricated linear layout feature can be tolerated to an extent, so long as the variation in the vertical cross-section shape is predictable from a manufacturing perspective and does not adversely impact the manufacture of the given linear layout feature or its neighboring layout features. In this regard, the vertical cross-section shape corresponds to a cut of the as-fabricated linear layout feature in a plane perpendicular to the centerline of the linear layout feature.

Figure 15:
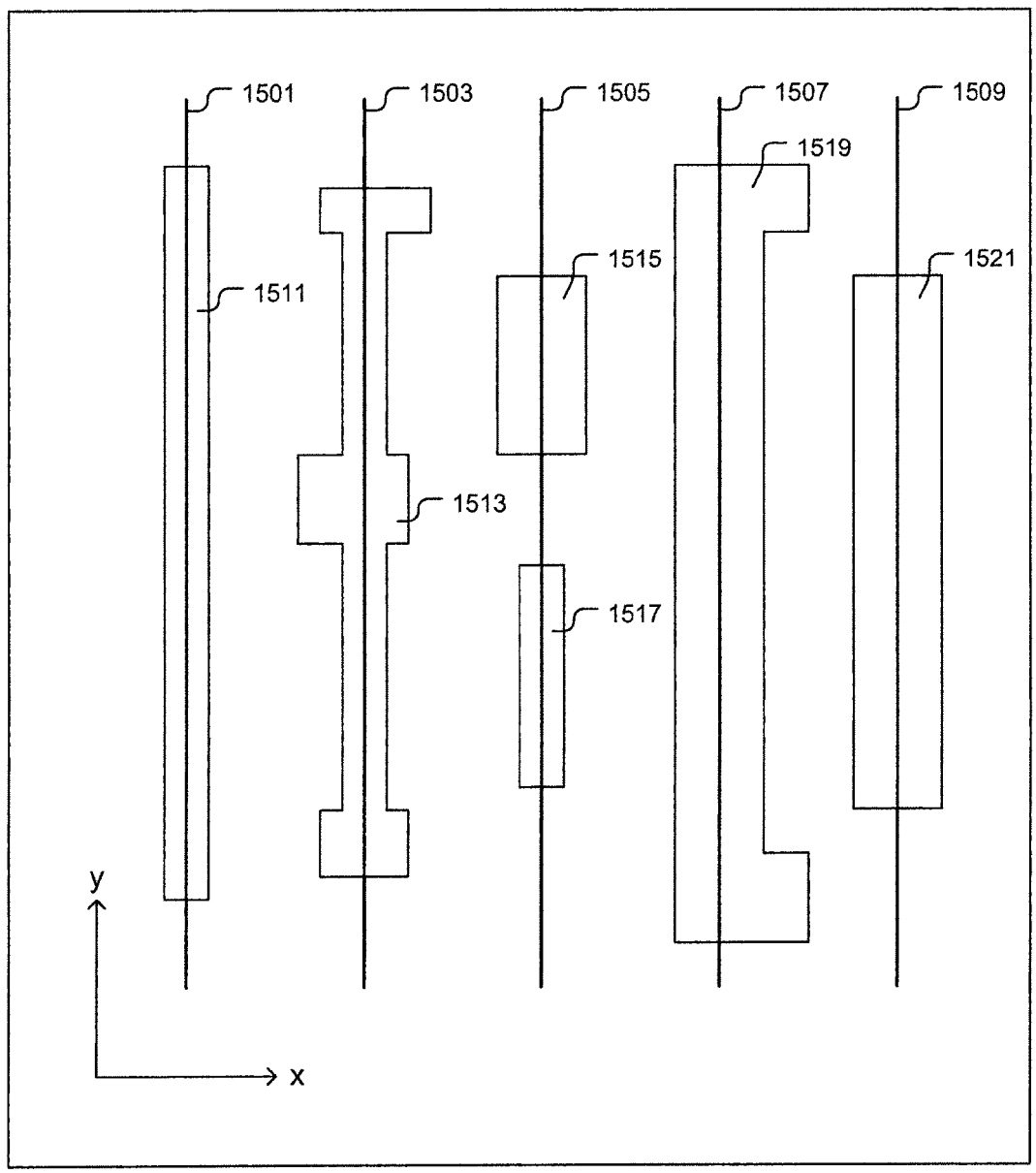
FIG. 15 shows an exemplary chip level layout based on the dynamic array architecture, in accordance with one embodiment of the present invention.

FIG. 15 shows an exemplary chip level layout based on the dynamic array architecture, in accordance with one embodiment of the present invention. A number of virtual lines 1501, 1503, 1505, 1507, 1509 are each defined to extend across the substrate, i.e., across the chip level layout of the portion of the chip, in a single common direction (y direction). Each of linear layout features 1511, 1513, 1515, 1517, 1519, 1521 is defined to extend along a single virtual line (1501, 1503, 1505, 1505, 1507, 1509, respectively), without contacting a neighboring linear layout feature that extends along a different virtual grate line. Some linear layout features, such as 1511, 1515, 1517, 1521, are defined to have a substantially rectangular cross-section when viewed in their as-drawn state. Whereas other linear layout features, such as 1513 and 1519, are defined to have some variation in width (in x direction) along their length (in y direction). It should be appreciated that although linear layout features 1513 and 1519 vary in width along their length, neither of linear layout features 1513 and 1519 contacts a neighboring linear layout feature that extends along a different virtual grate line.

In one embodiment, each linear layout feature of a given chip level is substantially centered upon one of the virtual lines of the virtual grate associated with the given chip level. A linear layout feature is considered to be substantially centered upon a particular virtual grate line when a deviation in alignment between of the centerline of the linear layout feature and the particular virtual grate line is sufficiently small so as to not reduce a manufacturing process window from what would be achievable with a true alignment between of the centerline of the linear layout feature and the virtual grate line. In one embodiment, the above-mentioned manufacturing process window is defined by a lithographic domain of focus and exposure that yields an acceptable fidelity of the layout feature. In one embodiment, the fidelity of a layout feature is defined by a characteristic dimension of the layout feature.

In another embodiment, some linear layout features in a given chip level may not be centered upon a virtual grate line. However, in this embodiment, the linear layout features remain parallel to the virtual lines of the virtual grate, and hence parallel to the other linear layout features in the given chip level. Therefore, it should be understood that the various linear layout features defined in a layout of a given chip level are oriented to extend across the given chip level in a parallel manner.

In one embodiment, within a given chip level defined according to the dynamic array architecture, proximate ends of adjacent, co-aligned linear layout features may be separated from each other by a substantially uniform gap. More specifically, adjacent ends of linear layout features defined along a common virtual grate line are separated by an end gap, and such end gaps within the chip level associated with the virtual grate may be defined to span a substantially uniform distance. Additionally, in one embodiment, a size of the end gaps is minimized within a manufacturing process capability so as to optimize filling of a given chip level with linear layout features.

Also, in the dynamic array architecture, a portion of a chip level can be defined to have any number of virtual grate lines occupied by any number of linear layout features. In one example, a portion of a given chip level can be defined such that all lines of its virtual grate are occupied by at least one linear layout feature. In another example, a portion of a given chip level can be defined such that some lines of its virtual grate are occupied by at least one linear layout feature, and other lines of its virtual grate are vacant, i.e., not occupied by any linear layout features. Furthermore, in a portion of a given chip level, any number of successively adjacent virtual grate lines can be left vacant. Also, the occupancy versus vacancy of virtual grate lines by linear layout features in a portion of a given chip level may be defined according to a pattern or repeating pattern across the given chip level.

In a given chip level, some of the linear layout features may form functional structures within an integrated circuit, and other linear layout features may be non-functional with respect to integrated circuit operation. It should be understood that the each of the linear layout features, regardless of function, is defined to extend across the chip level in the common direction of the virtual grate and to be devoid of a substantial change in direction along its length. It should be understood that each of the linear layout features, regardless of function, is defined such that no linear layout feature along a given virtual grate line is configured to connect directly within the same chip level to another linear layout feature defined along a different virtual grate line.

Additionally, within the dynamic array architecture, vias and contacts are defined to interconnect a number of layout features in various levels so as to form a number of functional electronic devices, e.g., transistors, and electronic circuits. Layout features for the vias and contacts can be aligned to a virtual grid. In one embodiment, a virtual grid is defined as a combination of virtual grates associated with a plurality of levels to which the vias and contacts will connect. Also, in one embodiment, a combination of virtual grates used to define a virtual grid can include one or more virtual grates defined independent from a particular chip level.

In the dynamic array architecture, a number of layout features in various chip levels form functional components of an electronic circuit. Additionally, some of layout features within various chip levels may be non-functional with respect to an electronic circuit, but are manufactured nonetheless so as to reinforce manufacturing of neighboring layout features. It should be understood that the dynamic array architecture is defined to enable accurate prediction of semiconductor device manufacturability with a high probability.

In view of the foregoing, it should be understood that the dynamic array architecture is defined by placement of linear layout features on a regular-spaced grate (or regular-spaced grid) in a number of levels of a cell, such that the linear layout features in a given level of the cell are oriented to be substantially parallel with each other in their traversal direction across the cell. As discussed above, in the dynamic array architecture, each as-drawn linear layout feature, i.e., prior to PCT processing, is defined to be devoid of a substantial change in direction relative to its traversal direction across the cell.

Cell

A cell, as referenced herein, represents an abstraction of a logic function, and encapsulates lower-level integrated circuit layouts for implementing the logic function. It should be understood that a given logic function can be represented by multiple cell variations, wherein the cell variations may be differentiated by feature size, performance, and process compensation technique (PCT) processing. For example, multiple cell variations for a given logic function may be differentiated by power consumption, signal timing, current leakage, chip area, OPC, RET, etc. It should also be understood that each cell description includes the layouts for the cell in each level of a chip, as required to implement the logic function of the cell. More specifically, a cell description includes layouts for the cell in each level of the chip extending from the substrate level up through a particular interconnect level.

Exemplary Embodiments

When routing conductors in a restricted architecture, such as the dynamic array architecture, multi-wire buses and multi-wire channels may be required. Various embodiments are disclosed herein for providing multi-wire buses and multi-wire channels that are connected using interlevel connectors, such as vias and contacts, which are placed according to a virtual grid. In one embodiment, interconnect chip level features, i.e., wires, in a given interconnect chip level are placed according to a virtual grate that is spatially related to the virtual grid for interlevel connector placement. As used herein the term wire refers to an electrically conductive structure defined within a level of a semiconductor chip. By way of example, wires may be formed of metal, polysilicon, or essentially any other electrically conductive material used in the manufacture of semiconductor chips. Also, in one embodiment, a wire can be defined by a local interconnect structure formed through doping and/or salicide processes.

FIG. 1A is an illustration showing placement of wires and interlevel connectors, in accordance with one embodiment of the present invention. Wires within a given chip level are centered on virtual lines of a virtual grate associated with the given chip level. In one embodiment, adjacent virtual lines within a given virtual grate are separated by a substantially uniform pitch. Vertically oriented wires 801c and 801d are placed in one interconnect chip level according to the virtual grate that includes virtual lines 803a, 803b, 803c. Horizontally oriented wires 801a and 801b are placed in another interconnect chip level according to the virtual grate that includes virtual lines 803d, 803e, 803f. As used herein, the term "vertical" refers to the Y-axis direction, and the term "horizontal" refers to the X-axis direction, wherein the X-Y plane is oriented substantially parallel to the underlying substrate of the chip. Additionally, as used herein, the term interlevel connector refers to an electrically conductive structure defined to extend between any two different chip levels to electrically connect a structure in one chip level to a structure in another chip level. Examples of interlevel connectors include without limitation vias, gate contacts, and diffusion contacts.

Interlevel connectors can be placed according to a virtual grid, wherein the virtual grid is defined by two perpendicularly oriented virtual grates. In one embodiment, the two perpendicularly oriented virtual grates of the virtual grid can be defined for two separate levels, e.g., for two separate interconnect chip levels in the case of vias, or for a gate chip level and an interconnect chip level in the case of gate contacts. In this embodiment, the virtual grates for the different levels may or may not have a specification dependency upon each other. Valid interlevel connector placement locations may be defined in a number of ways, including but not limited to, intersection points between virtual lines within a virtual grid, i.e., gridpoints in the virtual grid.

The perpendicular distance between parallel and adjacent virtual lines in a virtual grid is referred to as a virtual grid pitch, and may be determined in a number of ways. For example, the virtual grid pitch may be equal to a minimum wire, i.e., conductive feature, width plus a minimum wire-to-wire space. Also, the virtual grid pitch between adjacent vertically oriented virtual lines can be different from the virtual grid pitch between adjacent horizontally oriented virtual lines. Thus, a virtual grid for interlevel connector placement can include virtual grates associated with two different chip levels, wherein each of the virtual grates is defined by a different pitch.

FIG. 1A depicts a Rectangular Interlevel Connector Array (RICA) 805 defined by the two horizontal wires (801a and 801b), the two vertical wires (801c and 801d), and the interlevel connectors (802a, 802b, 802c, 802d) which connect them. It should be understood that the wires 801a-801d of FIG. 1A can represent any type of wire on any chip level. For example, wires 801c and 801d may represent conductive features of a gate chip level, and wires 801a and 801b may represent conductive features of a first interconnect chip level. In another example, wires 801c and 801d may represent conductive features of one interconnect chip level, and wires 801a and 801b may represent conductive features of another interconnect chip level. Also, in various embodiments, interlevel connectors 802a-802d can represent either vias or contacts, depending on the chip level and functionality of the wires 801a-801d to which they connect. It should be appreciated that in the embodiment of FIG. 1A, wires 801a and 801b are placed on virtual grate lines 803d and 803f, respectively. Similarly, wires 801c and 801d are placed on virtual grate lines 803a and 803c, respectively. Although the embodiment of FIG. 1A includes a vacant virtual grate line 803b between wires 801c and 801d, and a vacant virtual grate line 803e between wires 801a and 801b, in other embodiments, the virtual grate lines 803b and 803e may be occupied by wires (related or non-related), depending on wire spacing and wire width specifications/restrictions.

Each wire (801a-801d) may extend beyond an interlevel connector (802a-802d) by a specified extension distance or may continue to other routing points beyond the RICA 805. For example, wire 801a may be defined to have either of horizontal extensions 804a or 804c. Wire 801b may be defined to have either of horizontal extensions 804b or 804d. Wire 801c may be defined to have either of vertical extensions 804e or 804g. Wire 801d may be defined to have either of vertical extensions 804f or 804h. Also, horizontal/vertical extensions of wires beyond an interlevel connector may be defined in a related manner or may be defined independently. Also, an extension distance of a given wire beyond an interlevel connector location may be specified as necessary to satisfy design or layout requirements. In one embodiment, a wire may be defined to end essentially at an edge of an interlevel connector, thereby resulting in a substantially non-existent extension distance. Also, in one embodiment, a wire may be defined to partially traverse an interlevel connector, thereby resulting in a negative extension distance.

At a given RICA location, a 90-degree elbow intersection, a T-intersection, or a cross intersection may be formed by linear conductive features, e.g., wires, on two or more different chip levels. An elbow intersection occurs where a first wire on one chip level connects with a second wire on another chip level by way of an interlevel connector, and wherein each of the first and second wires terminates at or just beyond the connection location defined by the interlevel connector, and wherein the first and second wires extend in a substantially perpendicular direction relative to each other. In one embodiment of the elbow intersection, the first wire and/or second wire may extend partially across the interlevel connector used to connect the first and second wires. In this embodiment, the wire that extends partially across the interlevel connector is considered to have a negative extension distance with respect to the interlevel connector.

A T-intersection occurs where a first wire on one chip level connects with a second wire on another chip level by way of an interlevel connector, and wherein the first wire terminates at or just beyond the connection location defined by the interlevel connector, and wherein the second wire continues substantially beyond the connection location defined by the interlevel connector, and wherein the first and second wires extend in a substantially perpendicular direction relative to each other. In one embodiment of the T-intersection, the first wire may extend partially across the interlevel connector used to connect the first and second wires. In this embodiment, the first wire is considered to have a negative extension distance with respect to the interlevel connector. A cross intersection occurs where a first wire on one chip level connects with a second wire on another chip level by way of an interlevel connector, and wherein both the first and second wires continue substantially beyond the connection location defined by the interlevel connector, and wherein the first and second wires extend in a substantially perpendicular direction relative to each other.

Figure 1B:
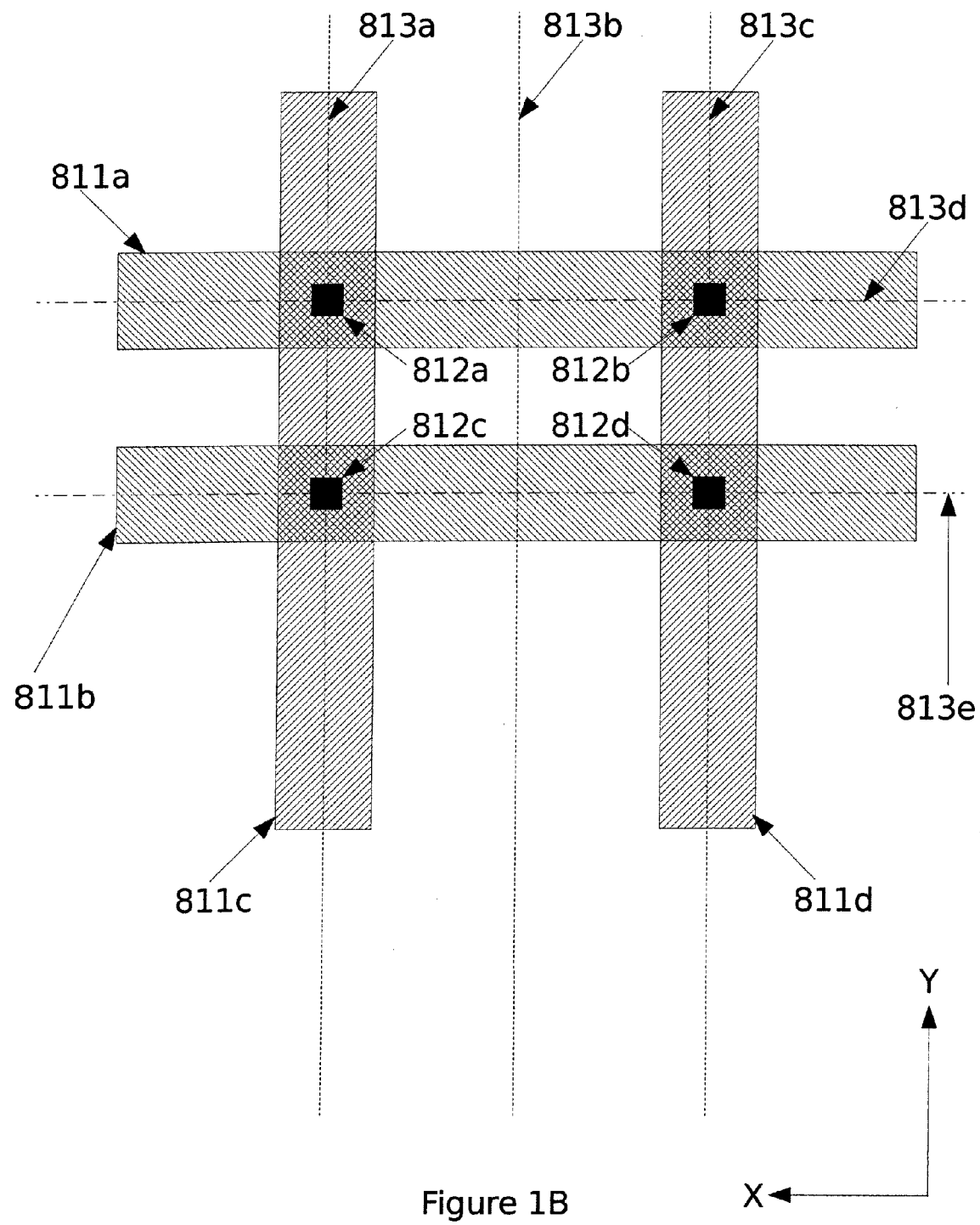
FIG. 1B shows an example layout in which a horizontally oriented virtual grate of an interlevel connector placement virtual grid allows for placement of interlevel connectors on adjacent virtual lines, in accordance with one embodiment of the present invention.

A virtual grid defined for interlevel connector placement may be specified such that orthogonally adjacent interlevel connector placements are allowed in one or both of the horizontal and vertical directions. In one embodiment, wires associated with an RICA may be placed on adjacent virtual grate lines. FIG. 1B shows an example where a horizontally oriented virtual grate (including virtual lines 813*d* and 813*e*) of an interlevel connector placement virtual grid (including virtual lines 813*a*-813*e*) allows for placement of interlevel connectors (812*a*/812*c* and 812*b*/812*d*) on adjacent virtual lines (813*d* and 813*e*). The interlevel connector 812*a* provides for connection of wires 811*a* and 811*c* defined on different chip levels. The interlevel connector 812*b* provides for connection of wires 811*a* and 811*d* defined on different chip levels. The interlevel connector 812*c* provides for connection of wires 811*b* and 811*c* defined on different chip levels. The interlevel connector 812*d* provides for connection of wires 811*b* and 811*d* defined on different chip levels.

Figure 1C:
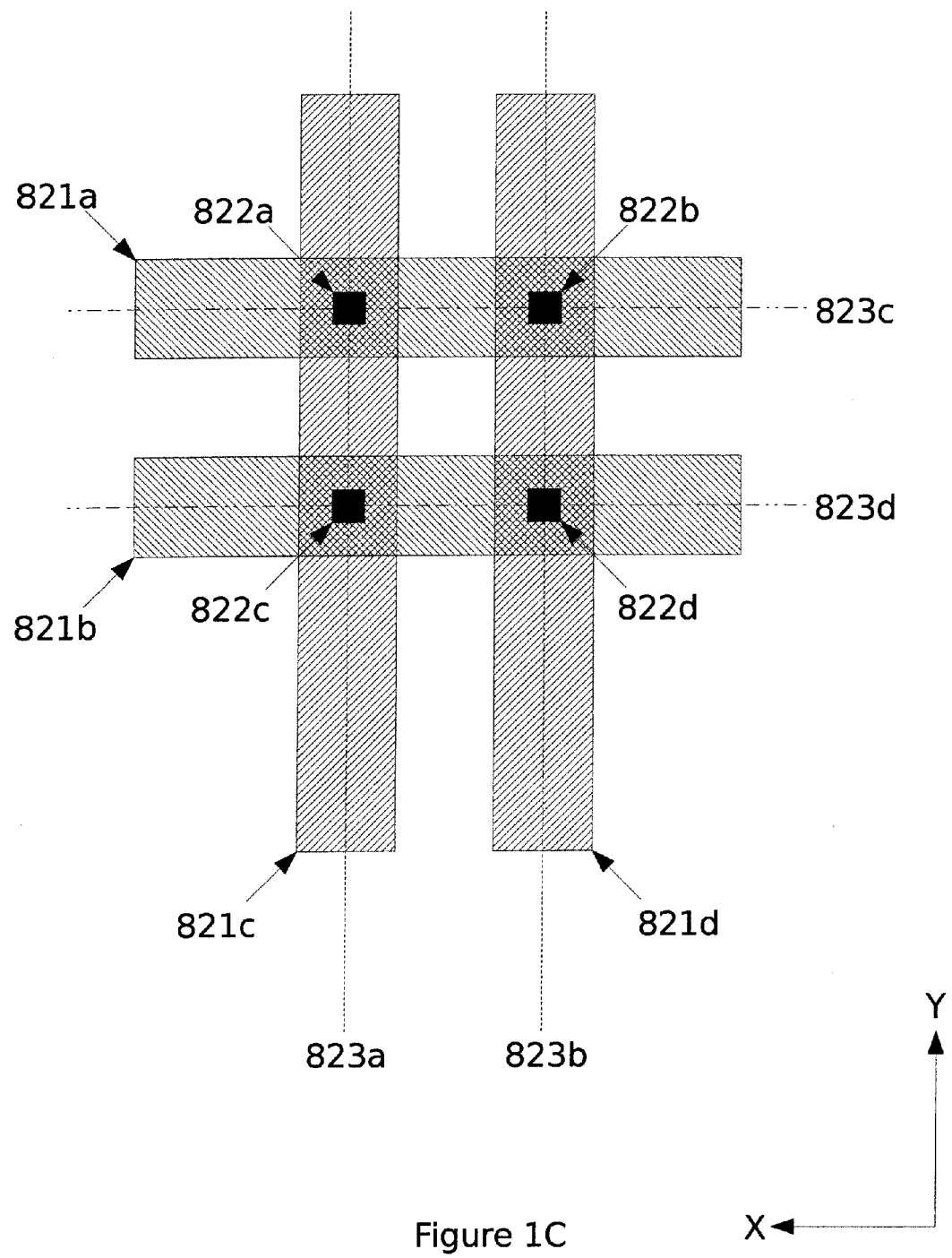
FIG. 1C shows an example layout in which an interlevel connector placement virtual grid allows for placement of interlevel connectors on adjacent virtual lines in both the horizontal and vertical directions, in accordance with one embodiment of the present invention.

FIG. 1C shows an example where an interlevel connector placement virtual grid (including virtual lines 823*a*-823*d*) allows for placement of interlevel connectors (822*a*-822*d*) on adjacent virtual lines in both the horizontal and vertical directions. The interlevel connector 822*a* provides for connection of wires 821*a* and 821*c* defined on different chip levels. The interlevel connector 822*b* provides for connection of wires 821*a* and 821*d* defined on different chip levels. The interlevel connector 822*c* provides for connection of wires 821*b* and 821*c* defined on different chip levels. The interlevel connector 822*d* provides for connection of wires 821*b* and 821*d* defined on different chip levels.

Figure 2A:
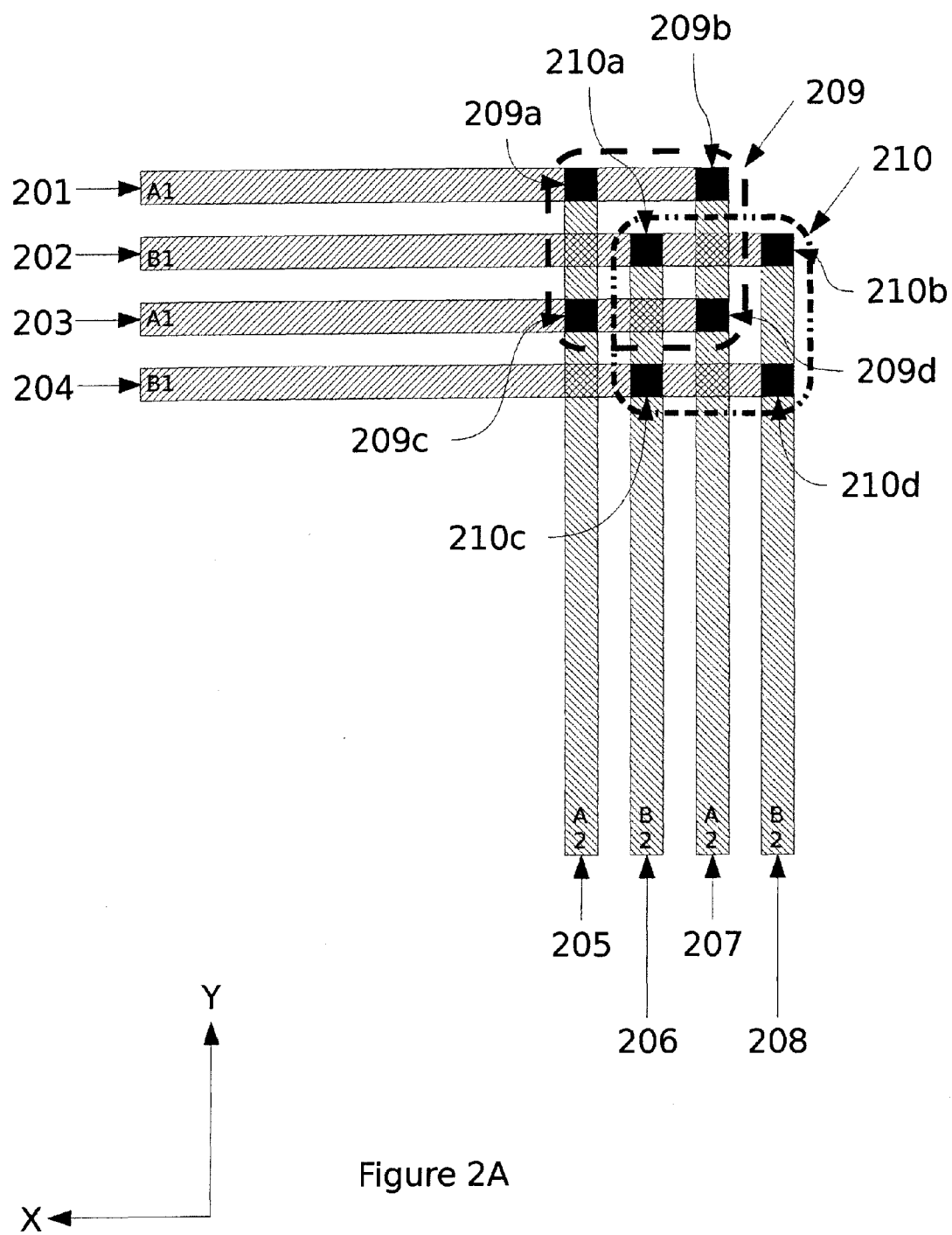
FIG. 2A shows an example layout in which multiple wires are used to form a conductor channel, in accordance with one embodiment of the present invention.

When designing in accordance with the dynamic array architecture or other restricted architecture, multiple wires may be used to replicate the function of a single wire of larger width. FIG. 2A shows an example layout in which multiple wires are used to form a conductor channel, wherein the conductor channel is electrically equivalent to a single conductor, i.e., single wire. Specifically, multiple wires 201 and 203 form a first conductor channel A1. Multiple wires 202 and 204 form a second conductor channel B1. Multiple wires 205 and 207 form a third conductor channel A2. Multiple wires 206 and 208 form a fourth conductor channel B2. In one embodiment, each of the conductor channels A1, A2, B1, and B2 is defined to respectively replace a single larger wire. It should be understood that a given conductor channel may be defined by any number of wires greater than one. Also, it should be understood that conductor channels defined within different chip levels can be connected to each other by way of a RICA. A number of exemplary embodiments are disclosed herein for RICA-connected conductor channels in which the connected conductor channels extend in perpendicular directions with respect to each other. However, it should be understood that in various embodiments, RICA-connected conductor channels in different chip levels may extend in a common direction or in different directions.

In the example of FIG. 2A, RICA 209 is formed by interlevel connectors 209*a*-209*d* to connect the horizontal conductor channel A1 to the vertical conductor channel A2, thereby associating both conductor channels A1 and A2 with a common net A. Also, RICA 210 is formed by interlevel connectors 210*a*-210*d* to connect the horizontal conductor channel B1 to the vertical conductor channel B2, thereby associating both conductor channels B1 and B2 with a common net B. The RICAs 209 and 210 are overlapped such that the interlevel connectors 209*a*-209*d* and 210*a*-210*d* are placed in a non-adjacent manner. More specifically, interleaving of the conductor channel wires 201-208 enables overlapping of the RICAs 209 and 210 to connect the horizontal conductor channels A1 and B1 to the vertical conductor channels A2 and B2, respectively, without either horizontally adjacent or vertically adjacent interlevel connector placements within the RICAs 209, 210.

Overlapped RICAs with corresponding interleaved conductor channel wires may be utilized to avoid interlevel connector placements with a center-line spacing that is equivalent to the center-line spacing of wires on levels that connect to the interlevel connector under consideration. For example, overlapped RICAs with corresponding interleaved conductor channel wires may be used in a multi-wire bus to ensure a separation of more than one wire pitch between interlevel connector, or to avoid interlevel connector placements on vertically or horizontally adjacent virtual grid lines. Placement of interlevel connectors on vertically or horizontally adjacent virtual grid lines is referred to herein as an orthogonally adjacent placement. Also, by interleaving the wires of the different conductor channels, a dense interlevel connector placement pattern can be obtained at the intersection of the vertically and horizontally oriented conductor channels (A1/A2, B1/B2) without use of orthogonally adjacent interlevel connector placements.

Figure 2B:
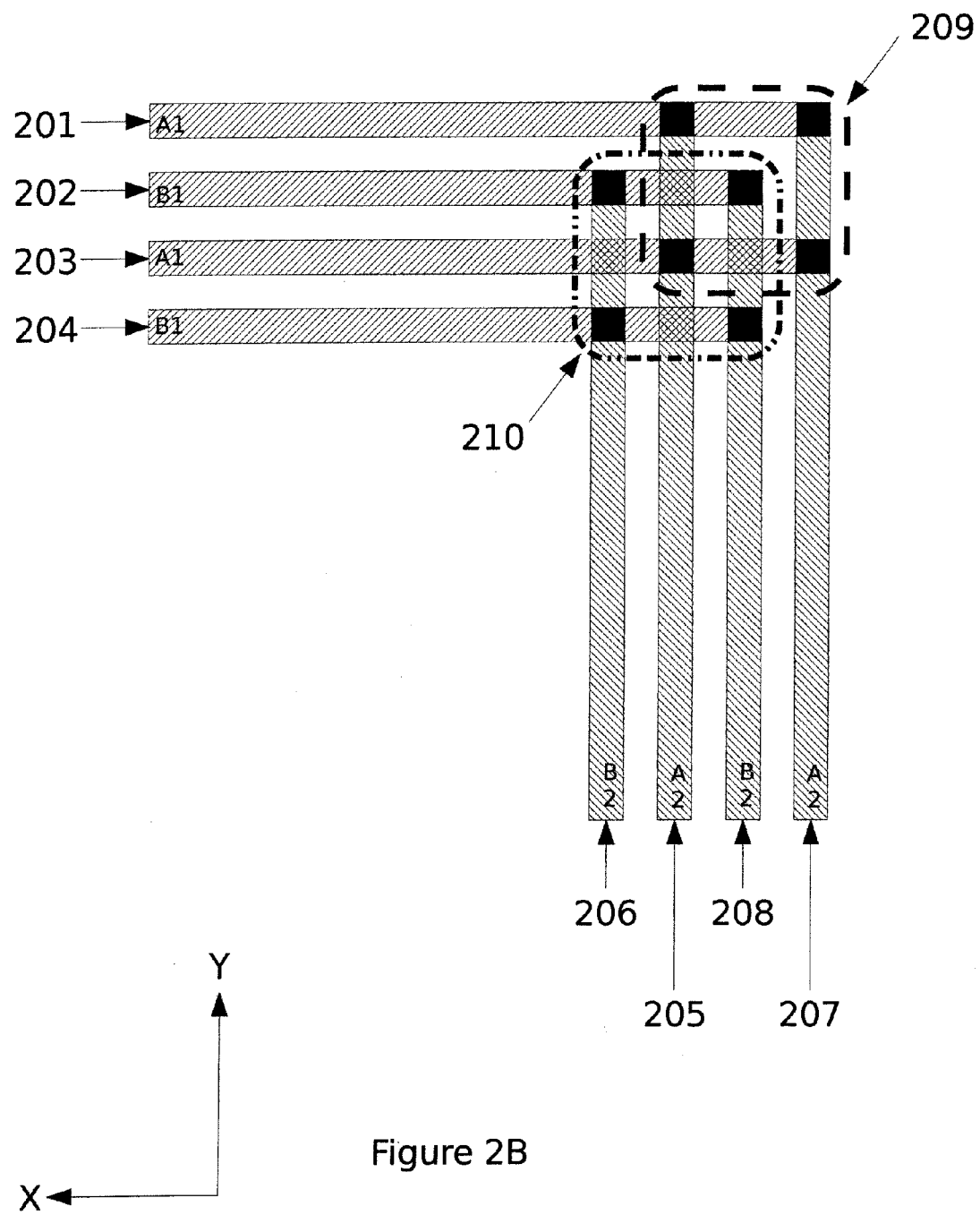
FIG. 2B shows a variation of the layout of FIG. 2A in which a horizontal position of the RICAs is reversed, in accordance with one embodiment of the present invention.

FIG. 2B shows a variation of the embodiment of FIG. 2A in which a horizontal position of RICAs 209 and 210 is reversed. The horizontal position reversal of RICAs 209 and 210 causes connected wires of the connected conductor channels to maintain an inner-to-outer sequence through the RICAs 209 and 210. Specifically, innermost wire 204 of conductor channel B1 is connected to innermost wire 206 of conductor channel B2. Also, outermost wire 201 of conductor channel A1 is connected to outermost wire 207 of conductor channel A2. By maintaining the inner-to-outer conductor channel wire sequence at interlevel connector locations within the RICA, an edge relationship between adjacent wires may be averaged over a run length of the conductor channels. This technique can be employed with any number of conductor channels and with any number of wires per conductor channel.

Figure 3:
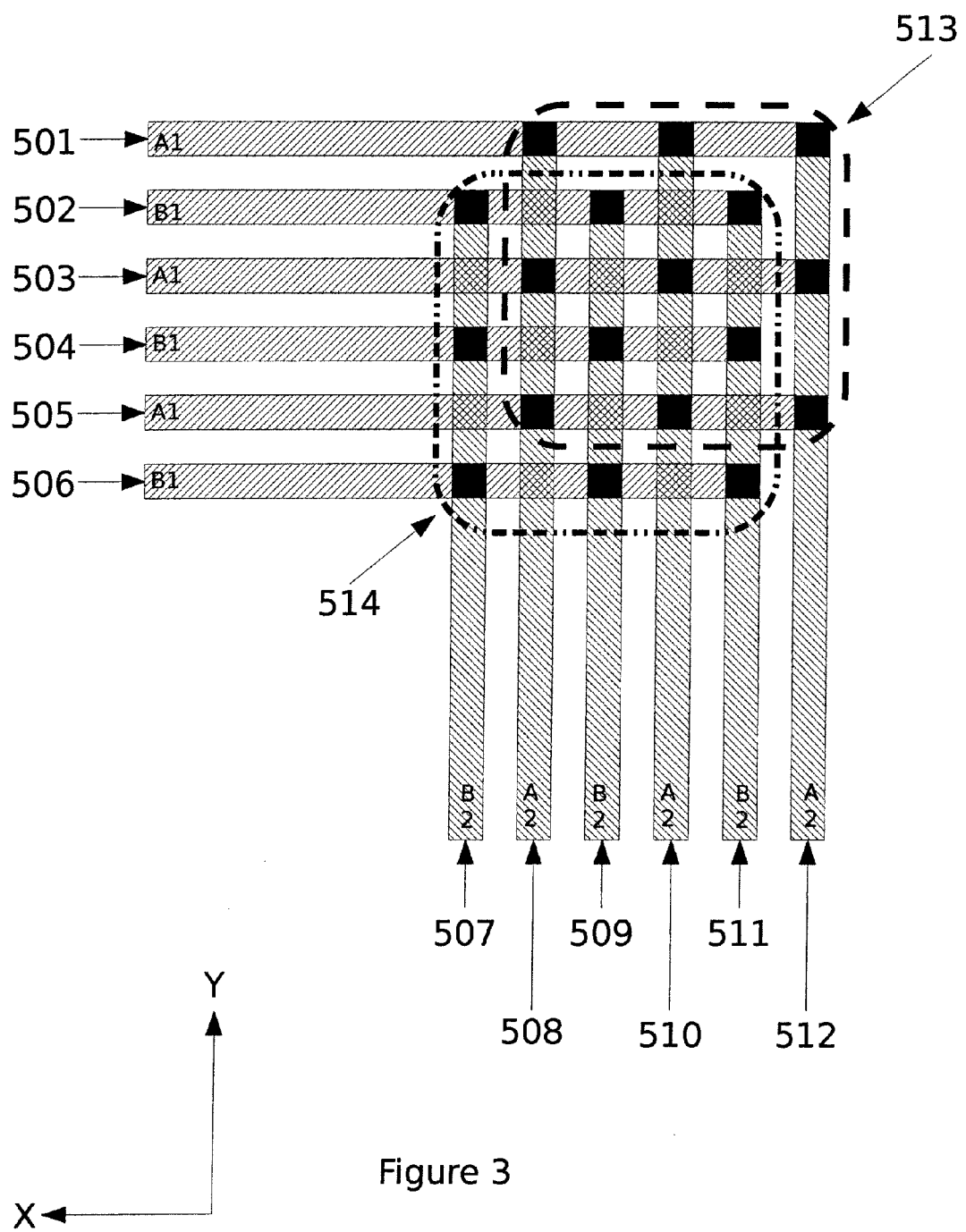
FIG. 3 shows an example layout in which multiple 3-wire conductor channels are interleaved and connected through a pair of overlapping RICAs, in accordance with one embodiment of the present invention.

Overlapping RICAs can be extended to connect any number of conductor channels and to accommodate any number of wires per conductor channel. FIG. 3 shows an example embodiment in which interleaved 3-wire conductor channels are connected through a pair of overlapping RICAs 513 and 514. A first conductor channel A1 is formed by horizontal wires 501, 503, and 505. A second conductor channel B1 is formed by horizontal wires 502, 504, and 506. A third conductor channel A2 is formed by vertical wires 508, 510, and 512. A fourth conductor channel B2 is formed by vertical wires 507, 509, and 511. It should be understood that horizontal wires 501-506 are defined in a chip level separate from vertical wires 507-512. The RICA 513 includes interlevel connectors defined to connect horizontally oriented conductor channel A1 to vertically oriented conductor channel A2, thereby associating both conductor channels A1 and A2 with a net A. The RICA 514 includes interlevel connectors defined to connect horizontally oriented conductor channel B1 to vertically oriented conductor channel B2, thereby associating both conductor channels B1 and B2 with a net B.

Figure 4:
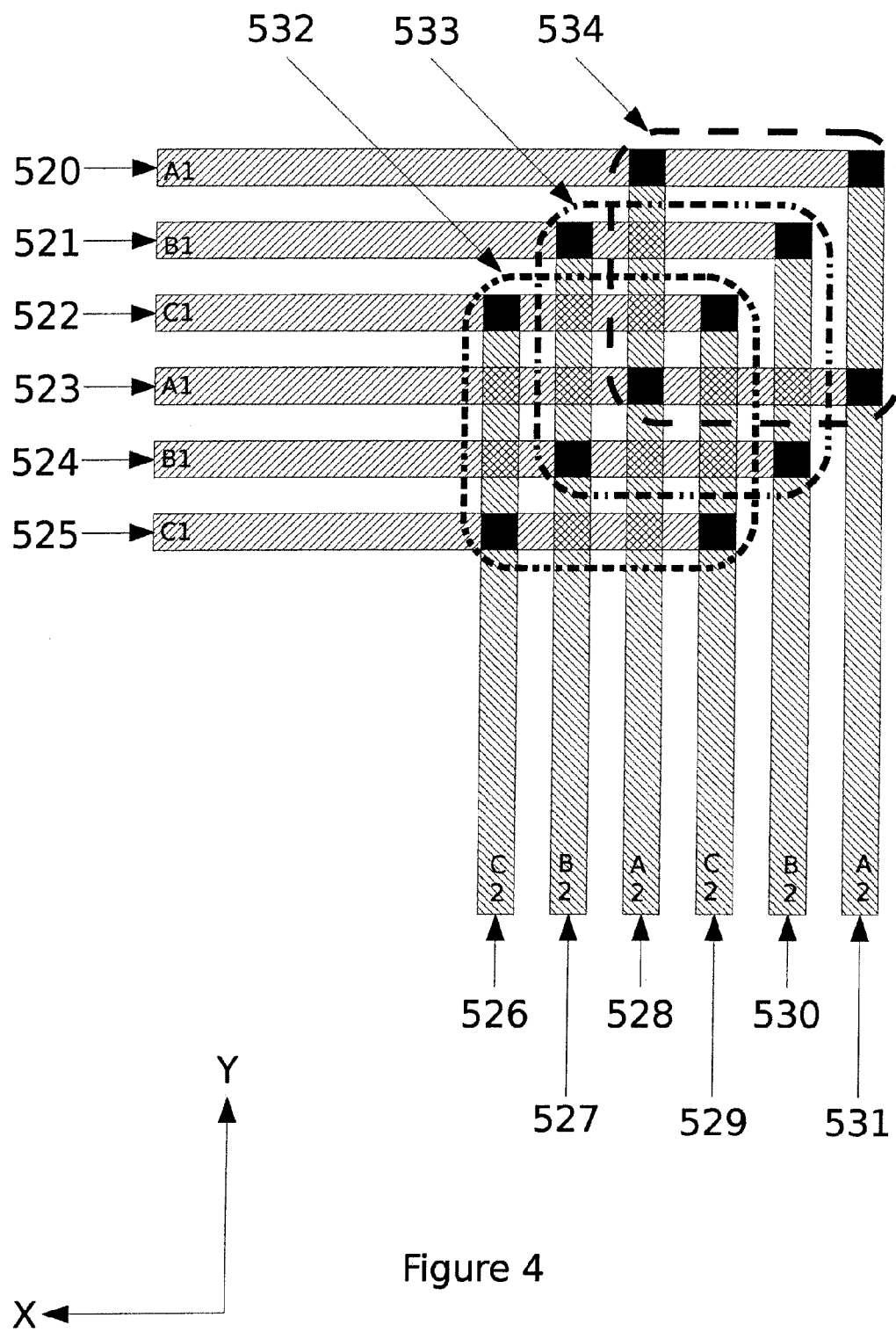
FIG. 4 shows an example layout in which three 2-wire conductor channels are routed horizontally to connect with three 2-wire conductor channels that are routed vertically, in accordance with one embodiment of the present invention.

FIG. 4 shows an example embodiment in which three 2-wire conductor channels (A1, B1, C1) are routed horizontally to connect with three 2-wire conductor channels (A2, B2, C2) that are routed vertically. Specifically, conductor channel A1 (defined by wires 520 and 523) is routed horizontally to connect with vertically routed conductor channel A2 (defined by wires 528 and 531) through RICA 534. Conductor channel B1 (defined by wires 521 and 524) is routed horizontally to connect with vertically routed conductor channel B2 (defined by wires 527 and 530) through RICA 533. Conductor channel C1 (defined by wires 522 and 525) is routed horizontally to connect with vertically routed conductor channel C2 (defined by wires 526 and 529) through RICA 532. In various embodiments, the wires 520-525 of the horizontal conductor channels A1, B1, and C1 can be interleaved in different orders, with the wires of the vertical conductor channels A2, B2, and C2 correspondingly interleaved. However, in an embodiment in which the interlevel connector placement virtual grid does not support orthogonally adjacent interlevel connector placement, the wires 520-525 of the horizontal conductor channels A1, B1, C1 should be arranged so as to avoid adjacent routing of multiple wires of the same conductor channel. Similarly, in this embodiment, the wires 526-531 of the vertical conductor channels A2, B2, C2 should be arranged so as to avoid adjacent routing of multiple wires of the same conductor channel.

Figure 5:
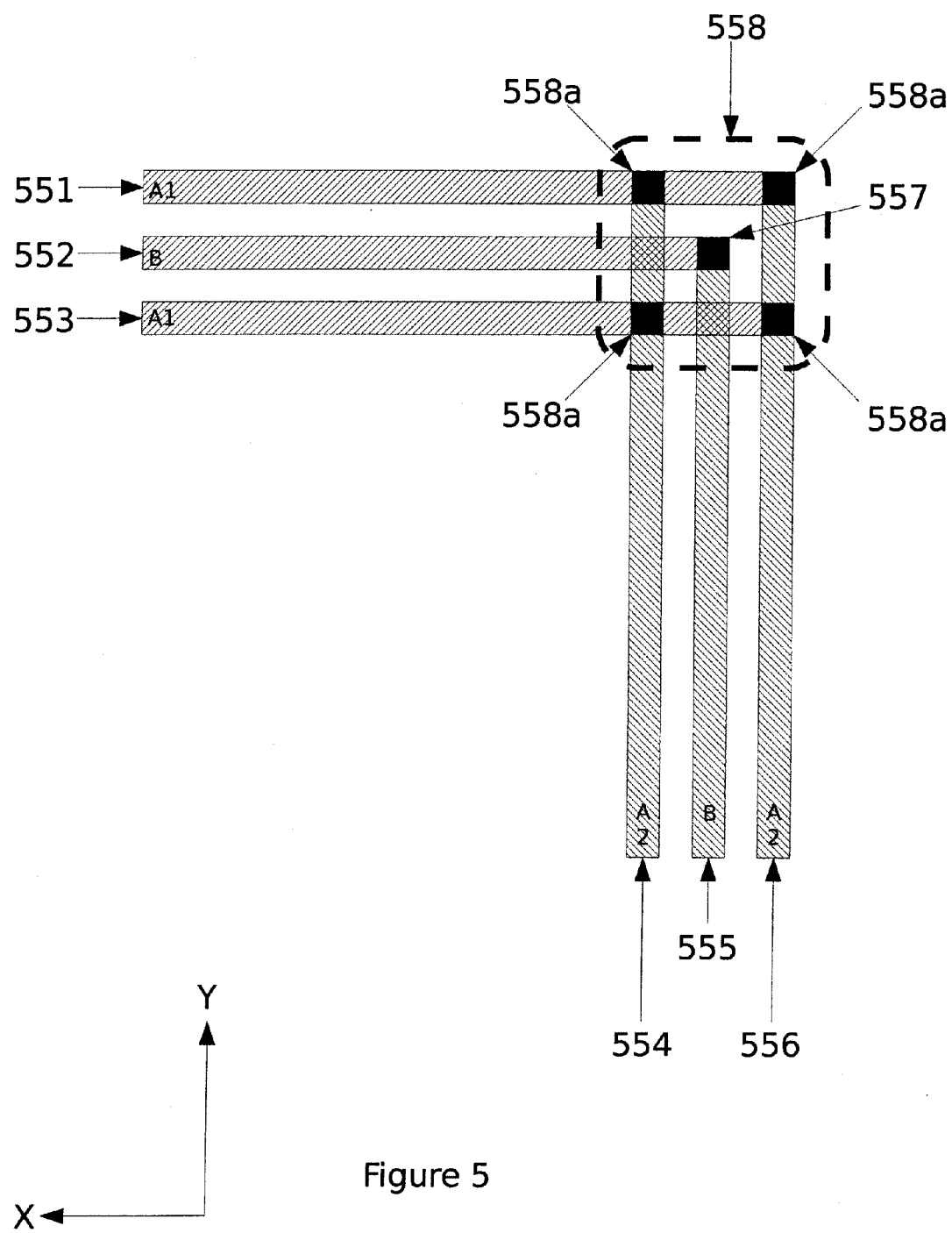
FIG. 5 shows an example layout in which a single-wire routing is defined within a multi-wire conductor channel, in accordance with one embodiment of the present invention.

FIG. 5 shows an example embodiment in which a single-wire routing is defined within a multi-wire conductor channel. Wires 551 and 553 define a horizontal conductor channel A1. Wires 554 and 556 define a vertical conductor channel A2. The horizontal and vertical conductor channels A1 and A2 are connected together by a RICA 558 defined by interlevel connectors 558a. A single-wire routing net B is defined by a horizontal wire 552, connected through an interlevel connector 557 to a vertical wire 555. Because the single-wire routing interlevel connector 557 is placed within the RICA 558, the single-wire routing wire 552 is placed within horizontal conductor channel A1, and the single-wire routing wire 555 is placed within the vertical conductor channel A2. It should be understood that in various embodiments, the horizontal wire 552 and/or the vertical wire 555 can be defined to extend beyond the interlevel connector 557, and even beyond the RICA 558. Also, it should be appreciated that essentially any number of single-wire routings can be placed within, i.e., interleaved with, one or more conductor channels.

Figure 6:
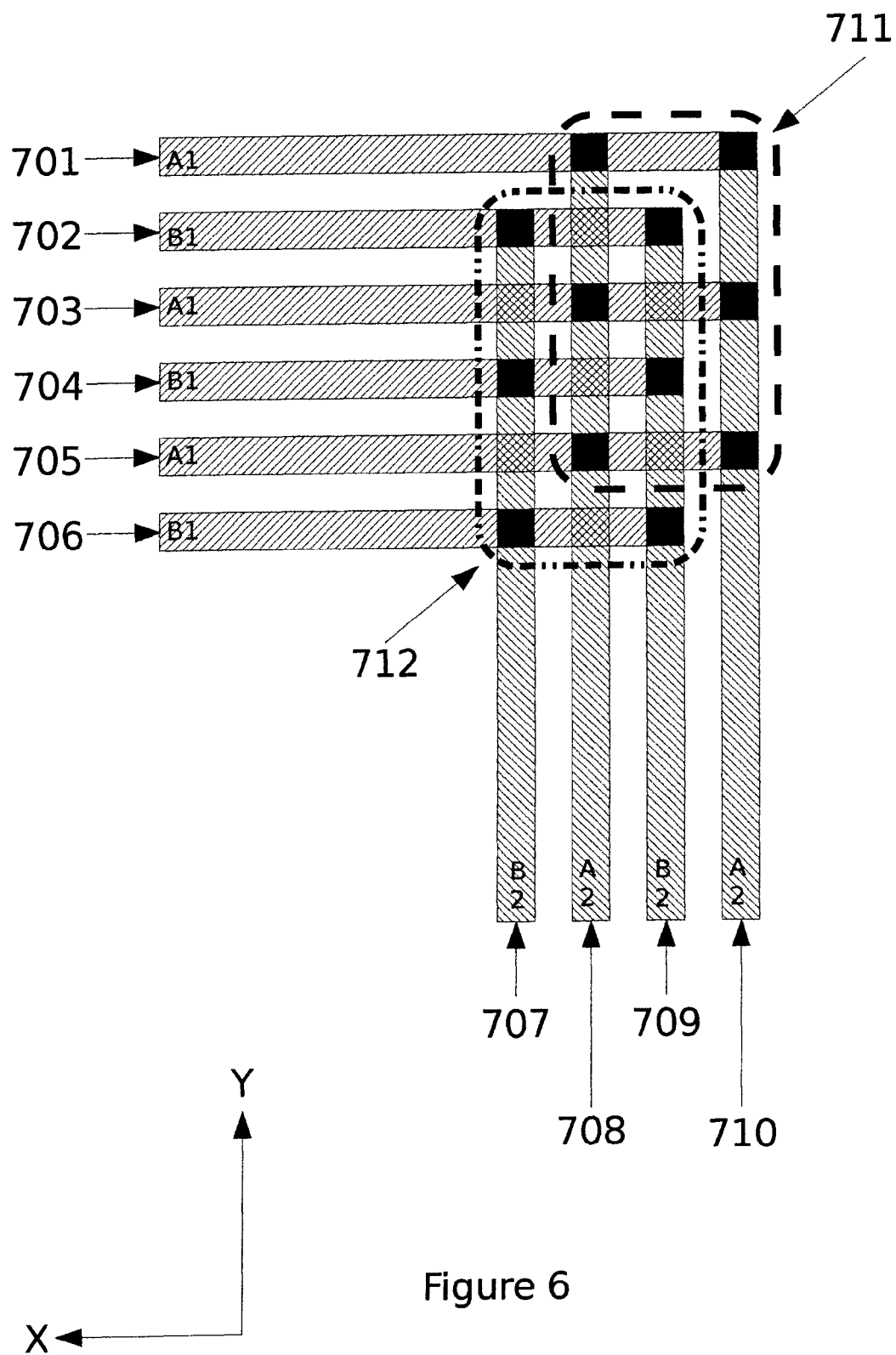
FIG. 6 shows an example layout in which RICAs are used to connect two interleaved 3-wire conductor channels with two interleaved 2-wire conductor channels, in accordance with one embodiment of the present invention.

RICAs may be used to connect two or more multi-wire conductor channels that have different numbers of wires per conductor channel. FIG. 6 shows an example embodiment in which RICAs 711 and 712 are used to connect two interleaved 3-wire conductor channels (A1 and B1) with two interleaved 2-wire conductor channels (A2 and B2). Horizontal conductor channel A1 is defined by wires 701, 703, and 705. Horizontal conductor channel B1 is defined by wires 702, 704, and 706. Vertical conductor channel A2 is defined by wires 708 and 710. Vertical conductor channel B2 is defined by wires 707 and 709. RICA 711 includes interlevel connectors placed to connect the horizontal conductor channel A1 with the vertical conductor channel A2. Therefore, RICA 711 is defined to transition the 3-wire horizontal conductor channel A1 into the 2-wire vertical conductor channel A2, vice-versa. RICA 712 includes interlevel connectors placed to connect the horizontal conductor channel A2 with the vertical conductor channel B2. Therefore, RICA 712 is defined to transition the 3-wire horizontal conductor channel B1 into the 2-wire vertical conductor channel B2, vice-versa. Also, the interleaving of the conductor channel A1 wires (701, 703, 705) with the conductor channel B1 wires (702, 704, 706), and the interleaving of the conductor channel A2 wires (708, 710) with the conductor channel B2 wires (707, 709) allows the interlevel connectors of RICAs 711 and 712 to be placed so as to avoid orthogonally adjacent interlevel connector placements.

Figure 7:
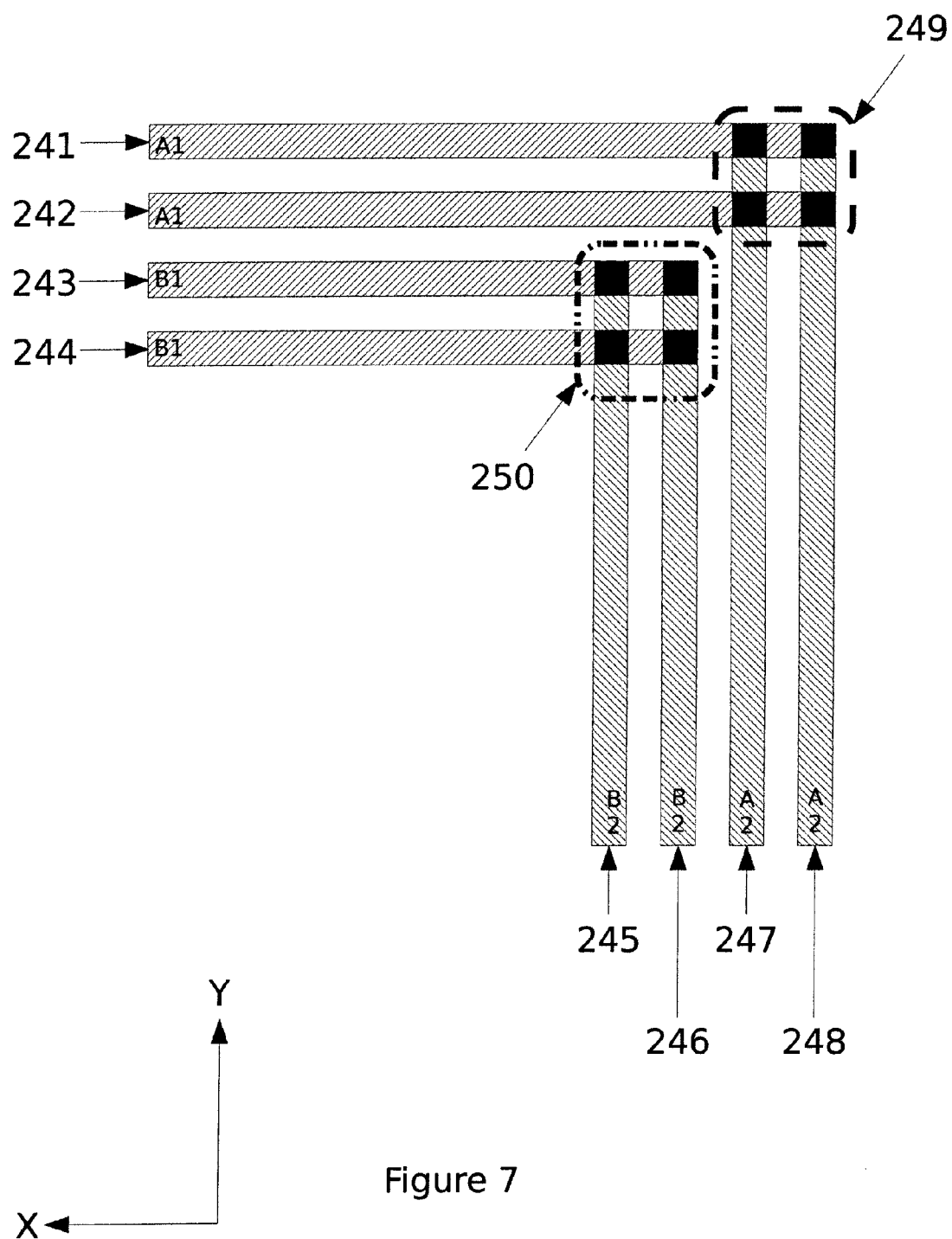
FIG. 7 shows an interlevel connector pattern used to connect non-interleaved horizontal and vertical multi-wire conductor channels, in accordance with one embodiment of the present invention.

If adjacent interlevel connector placements are allowed, non-interleaving interlevel connector patterns may be employed. FIG. 7 shows an example of an interlevel connector pattern used to connect non-interleaved horizontal and vertical multi-wire conductor channels. A horizontal conductor channel A1 defined by wires 241 and 242 is connected through a RICA 249 to a vertical conductor channel A2 defined by wires 247 and 248. Also, a horizontal conductor channel B1 defined by wires 243 and 244 is connected through a RICA 250 to a vertical conductor channel B2 defined by wires 245 and 246. Because the conductor channels A1 and B1 are non-interleaved, and because the conductor channels B2 and A2 are non-interleaved, the RICAs 249 and 250 do not overlap each other. Use of non-overlapping RICAs can be extended to any number of non-interleaved conductor channels, and to any number of wires per non-interleaved conductor channel.

Figure 8:
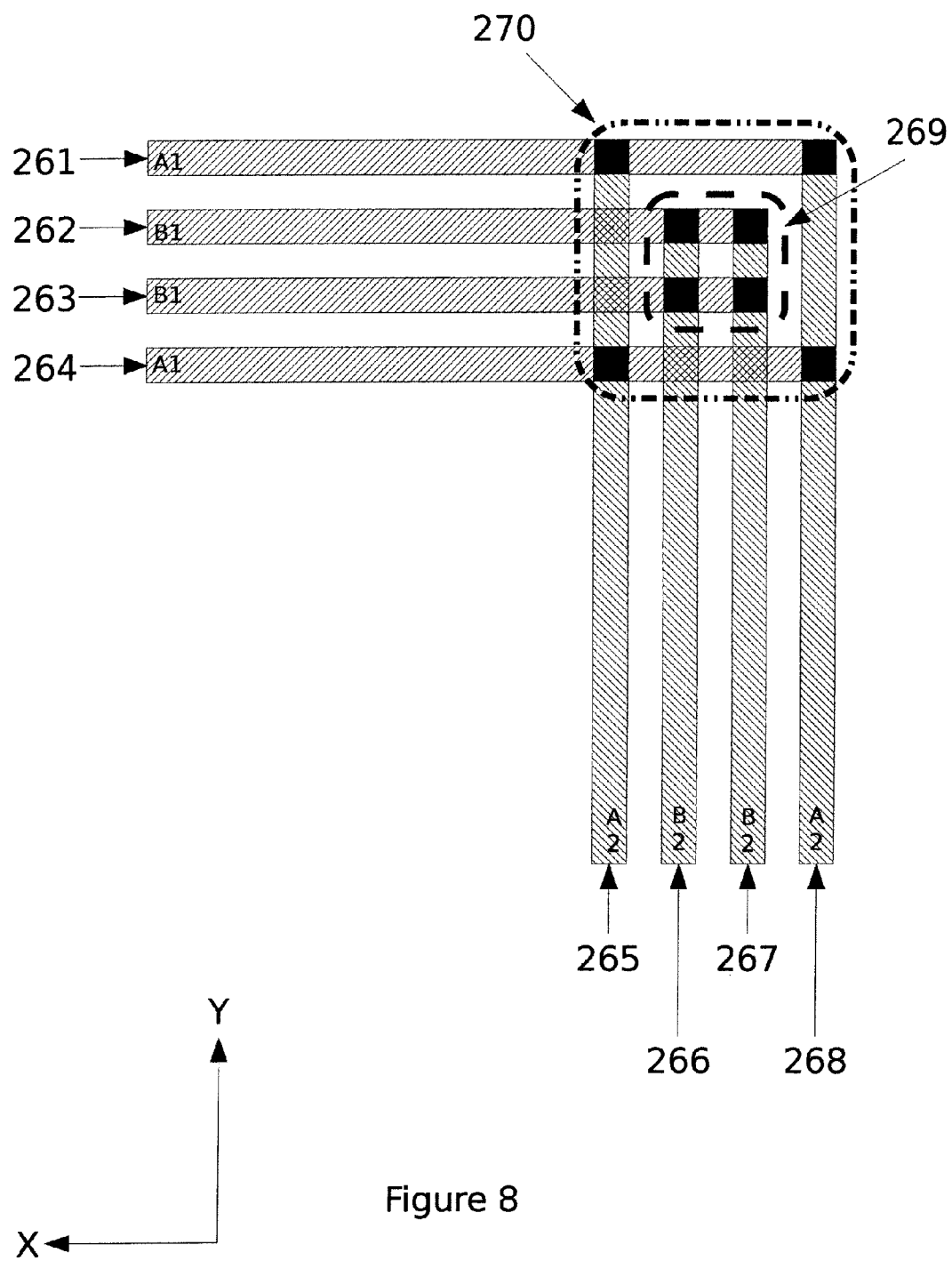
FIG. 8 shows an example layout in which a non-interleaved conductor channel is embedded within another conductor channel, in accordance with one embodiment of the present invention.

Additionally, a non-interleaved conductor channel can be embedded within one or more other conductor channels, thereby causing one RICA to be embedded within another RICA. FIG. 8 shows an example layout in which a non-interleaved conductor channel is embedded within another conductor channel. Specifically, a non-interleaved conductor channel B1 defined by wires 262 and 263 is connected through a RICA 269 to a conductor channel B2 defined by wires 266 and 267. Another conductor channel A1 defined by wires 261 and 264 is connected through a RICA 270 to a conductor channel A2 defined by wires 265 and 268. The horizontal conductor channel B1 is embedded within the horizontal conductor channel A1. Similarly, the vertical conductor channel B2 is embedded within the vertical conductor channel A2. Therefore, the RICA 269 is embedded within the RICA 270.

Figure 9A:
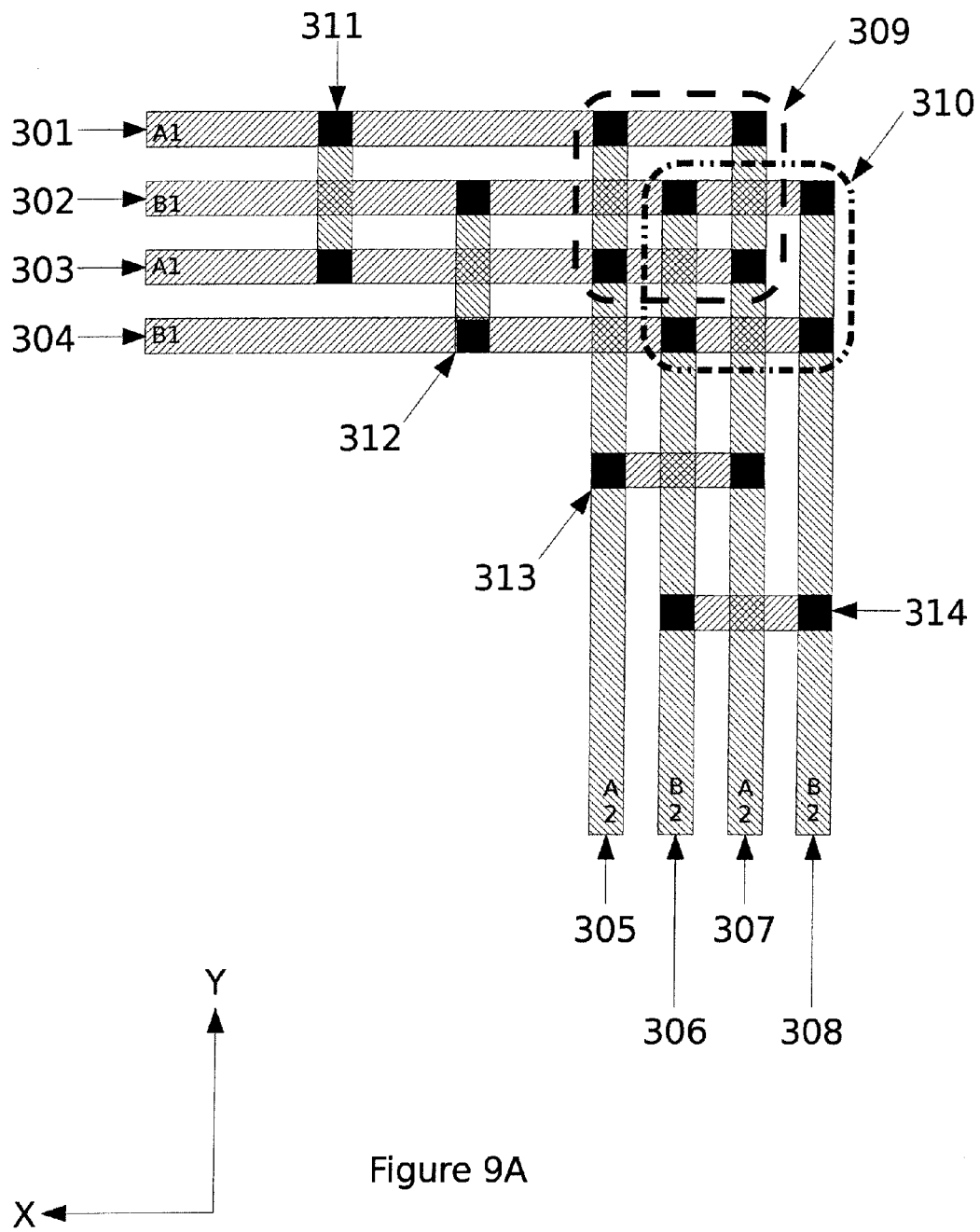
FIG. 9A shows an example of Opportunistic Strapping (OSt), in accordance with one embodiment of the present invention.

If additional redundancy or interconnection is required, a technique referred to herein as Opportunistic Strapping (OSt) may be employed. One method to perform OSt is to place and connect strap wires between member wires of the same conductor channel, wherein the strap wires are routed perpendicularly to the routing direction of the conductor channel wires to which they connect, and wherein the strap wires are defined on a different chip level than the conductor channel wires to which they connect. FIG. 9A shows an example of OSt. In FIG. 9A, RICA 309 connects horizontal conductor channel A1 defined by wires 301 and 303 to vertical conductor channel A2 defined by wires 305 and 307. Also, RICA 310 connects horizontal conductor channel B1 defined by wires 302 and 304 to vertical conductor channel B2 defined by wires 306 and 308. RICAs 309 and 310 are reinforced by periodic strapping of the horizontal and vertical wires to which they connect. Specifically, RICA 309 is reinforced by vertical strap wire 311 and by horizontal strap wire 313. Similarly, RICA 310 is reinforced by vertical strap wire 312 and by horizontal strap wire 314. It should be understood that OSt may include use of multiple commonly oriented strap wires to reinforce a given RICA.

Figure 9B:
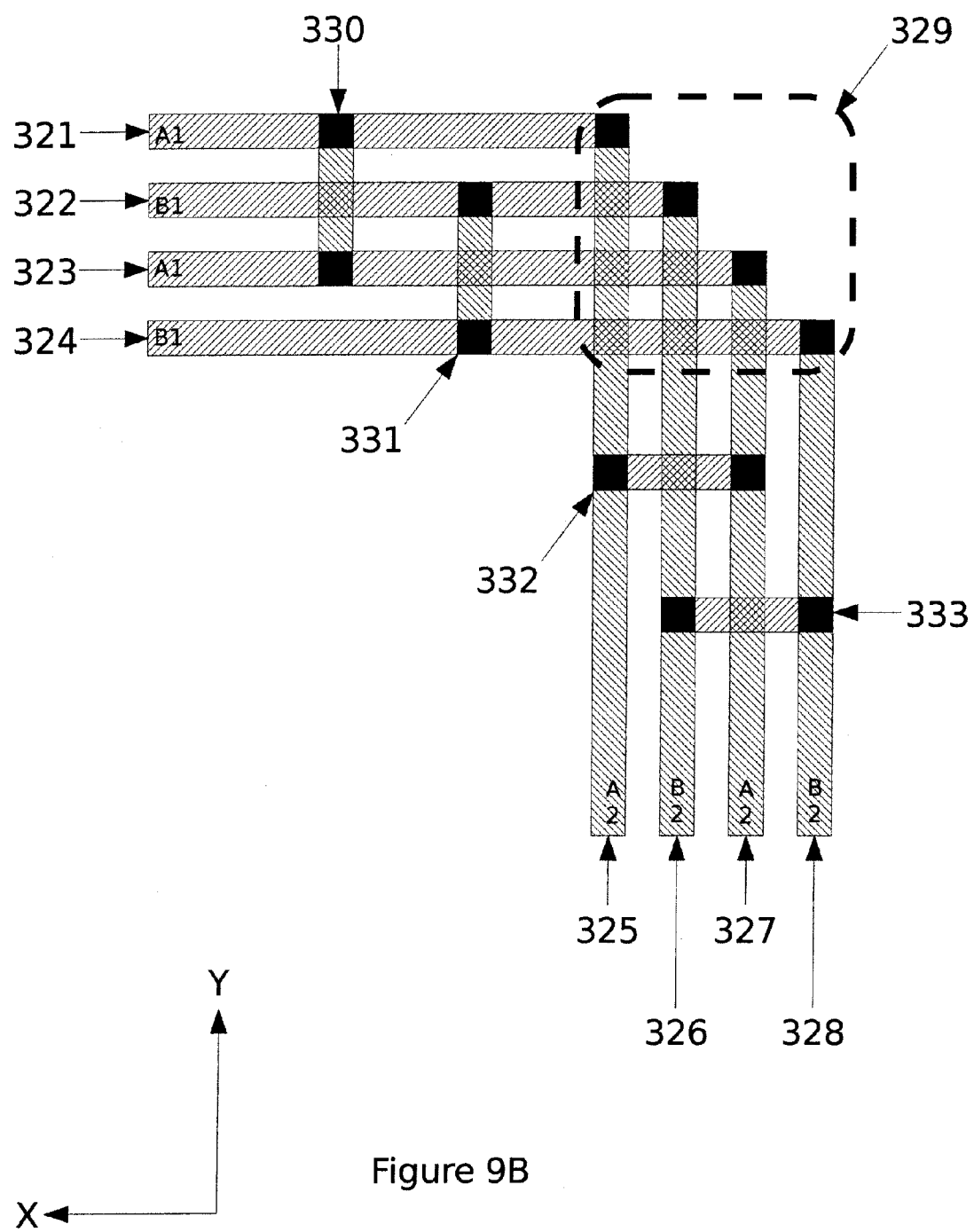
FIG. 9B shows an example layout in which a non-redundant RICA is used to connect multiple horizontal conductor channels to multiple vertical conductor channels, in accordance with one embodiment of the present invention.

OSt can also be used to add redundancy to a non-redundant RICA. FIG. 9B shows an example embodiment in which a non-redundant RICA 329 is used to connect a horizontal conductor channel A1 to a vertical conductor channel A2, and to connect a horizontal conductor channel B1 to a vertical conductor channel B2. While a non-redundant RICA, such as 329, provides no redundancy or interconnection between wires of a common conductor channel, use of a non-redundant RICA may be more area efficient in some layout instances. To compensate for the lack of interconnection and redundancy in a non-redundant RICA, strap wires can be added down the horizontal and vertical run lengths of the conductor channels entering the non-redundant RICA. For example, strap wire 330 is connected between wires 321 and 323 of horizontal conductor channel A1. Strap wire 331 is connected between wires 322 and 324 of horizontal conductor channel B1. Strap wire 332 is connected between wires 325 and 327 of vertical conductor channel A2. Strap wire 333 is connected between wires 326 and 328 of vertical conductor channel B2. Each of strap wires 330-333 reinforces the interlevel connections within non-redundant RICA 329.

In the OSt process, an extension of a strap wire beyond an interlevel connector to which it is connected may or may not be related to an extension of a channel wire beyond an interlevel connector in a RICA. Also, the extension of strap wires beyond their associated interlevel connectors may be specified globally or on per wire basis.

Figure 10:
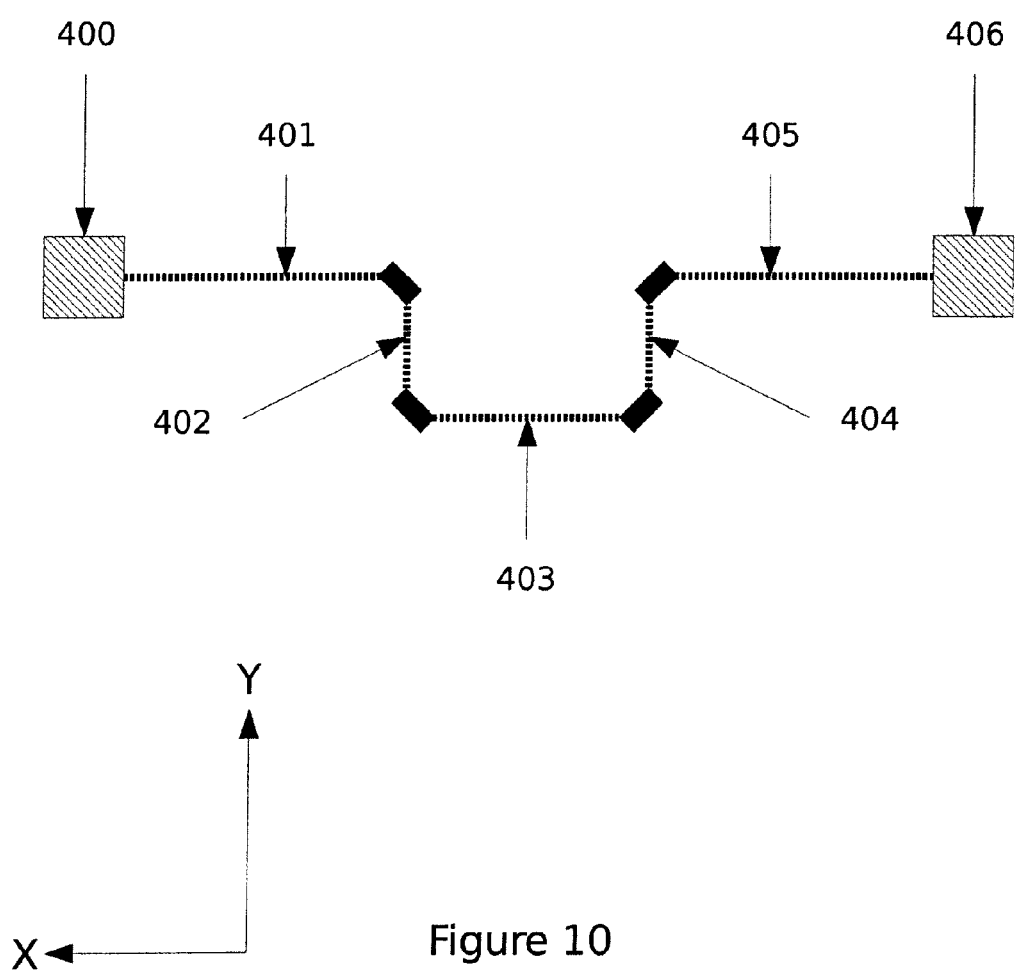
FIG. 10 shows an example routing between multiple locations in a chip layout, in accordance with one embodiment of the present invention.

In the OSt process, strap wires can be distributed along an entire length of a conductor channel segment. FIG. 10 shows an example routing between a location 400 and a location 406 in a chip layout. The routing depicted in FIG. 10 includes five conductor channel segments 401, 402, 403, 404, and 405. A number of strap wires can be placed along each conductor channel segment 401-405. Based on the degree of additional interconnect, redundancy required, desired segment capacitance and the proximity of nearby fill wires, a minimum number of OSt strap wires may be specified. In one embodiment, when local routing is completed, additional OSt strap wires are inserted in the layout as space permits. In one embodiment, a maximum number of OSt strap wires may be specified on a per route or per conductor channel segment basis.

Figure 11:
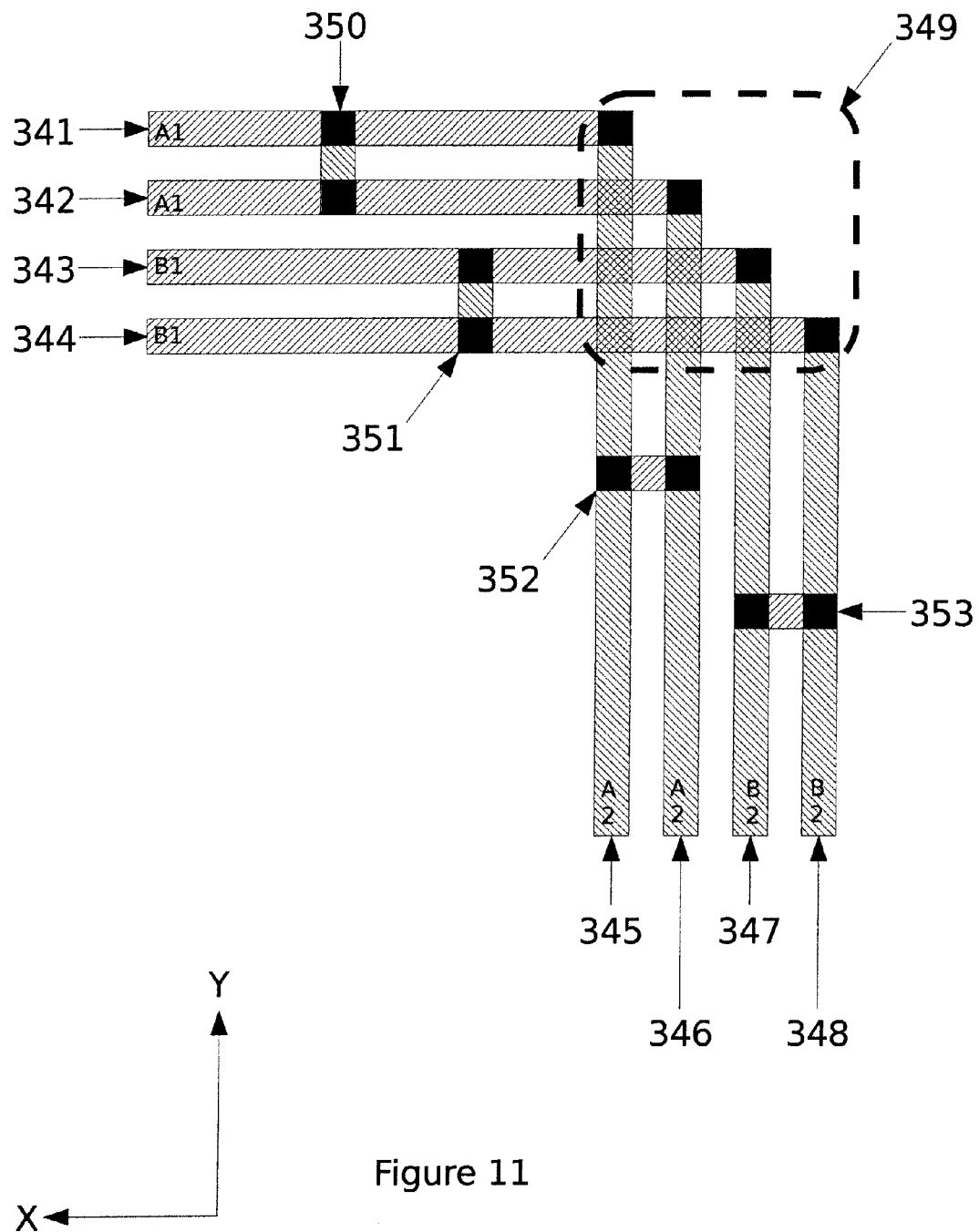
FIG. 11 shows an example layout in which OSt strap wires are used with non-interleaved conductor channels, in accordance with one embodiment of the present invention.

If adjacent interlevel connectors are permitted by the virtual grid, non-interleaved conductor channels may employ OSt strap wires. FIG. 11 shows an example layout in which OSt strap wires are used with non-interleaved conductor channels. A strap wire 350 is used to connect wires 341 and 342 of horizontal conductor channel A1. A strap wire 351 is used to connect wires 343 and 344 of horizontal conductor channel B1. A strap wire 352 is used to connect wires 345 and 346 of vertical conductor channel A2. A strap wire 353 is used to connect wires 347 and 348 of vertical conductor channel B2. The OSt strap wires 350-353 provide additional interconnect and redundancy to the interlevel connectors within the non-redundant RICA 349.

Figure 12A:
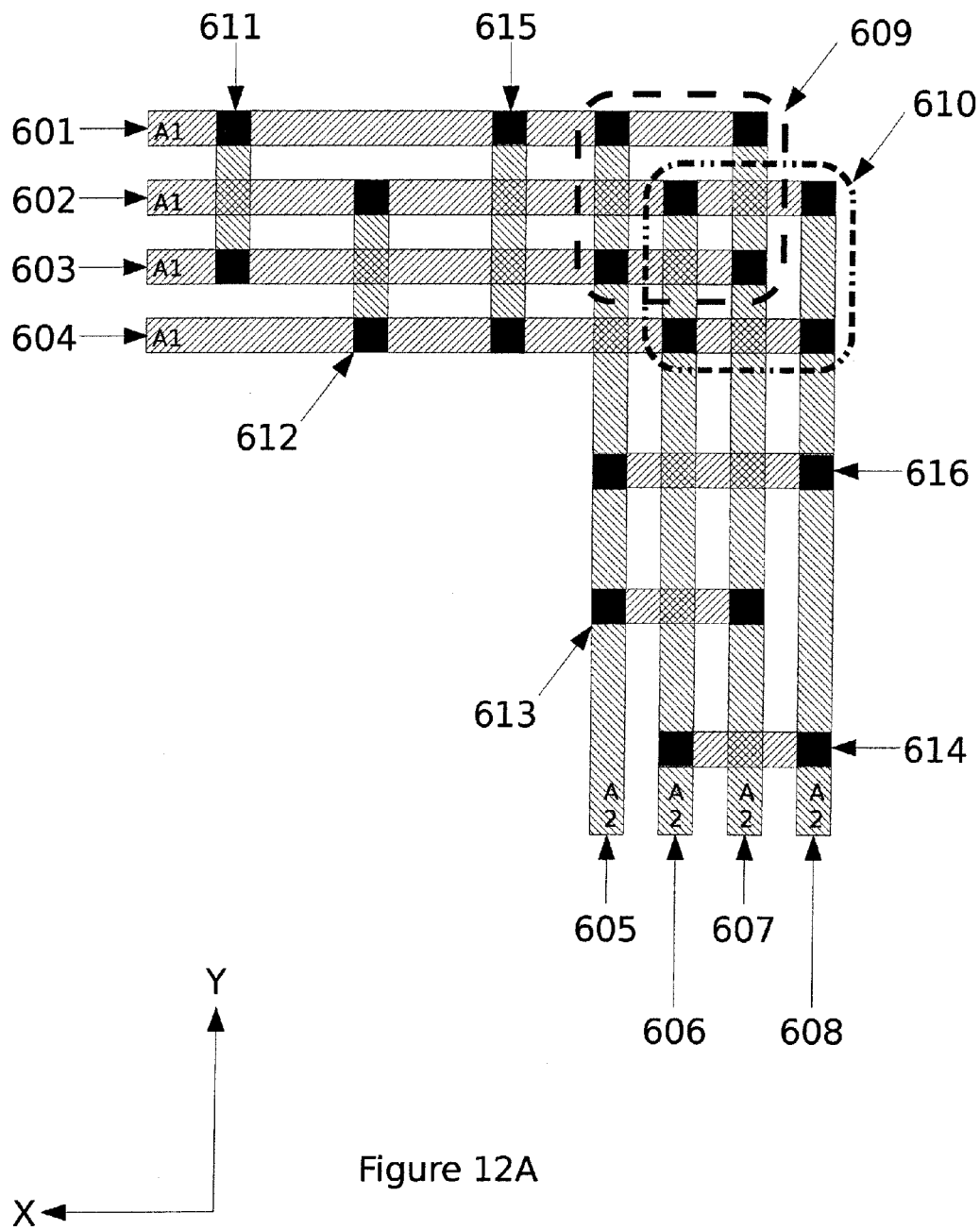
FIG. 12A shows use of supplemental OSt strap wires in a dense interlevel connector pattern without orthogonally adjacent interlevel connector placement, in accordance with one embodiment of the present invention.

A dense interlevel connector pattern without orthogonally adjacent interlevel connector placement can be supplemented by OSt strap wires to connect a multi-wire horizontal conductor channel to a multi-wire vertical conductor channel, when each of the horizontal and vertical conductor channels is defined by four or more wires, such as shown in FIG. 12A. RICA 609 connects wires 601 and 603 of horizontal conductor channel A1 to wires 605 and 607 of vertical conductor channel A2. RICA 610 connects wires 602 and 604 of horizontal conductor channel A1 to wires 606 and 608 of vertical conductor channel A2. The RICAs 609 and 610 do not connect all the wires of the horizontal conductor channel A1 to all the wires of the vertical conductor channel A2. However, the strap wires 615 and 616 supplement the connections made through the RICAs 609 and 610, such that each of the wires 601-604 of the horizontal conductor channel A1 is connected to each of the wires 605-608 of the vertical conductor channel A2. Additional OSt strap wires 611, 612, 613, and 614 can also be used to reinforce the connections made by RICAs 609 and 610.

Figure 12B:
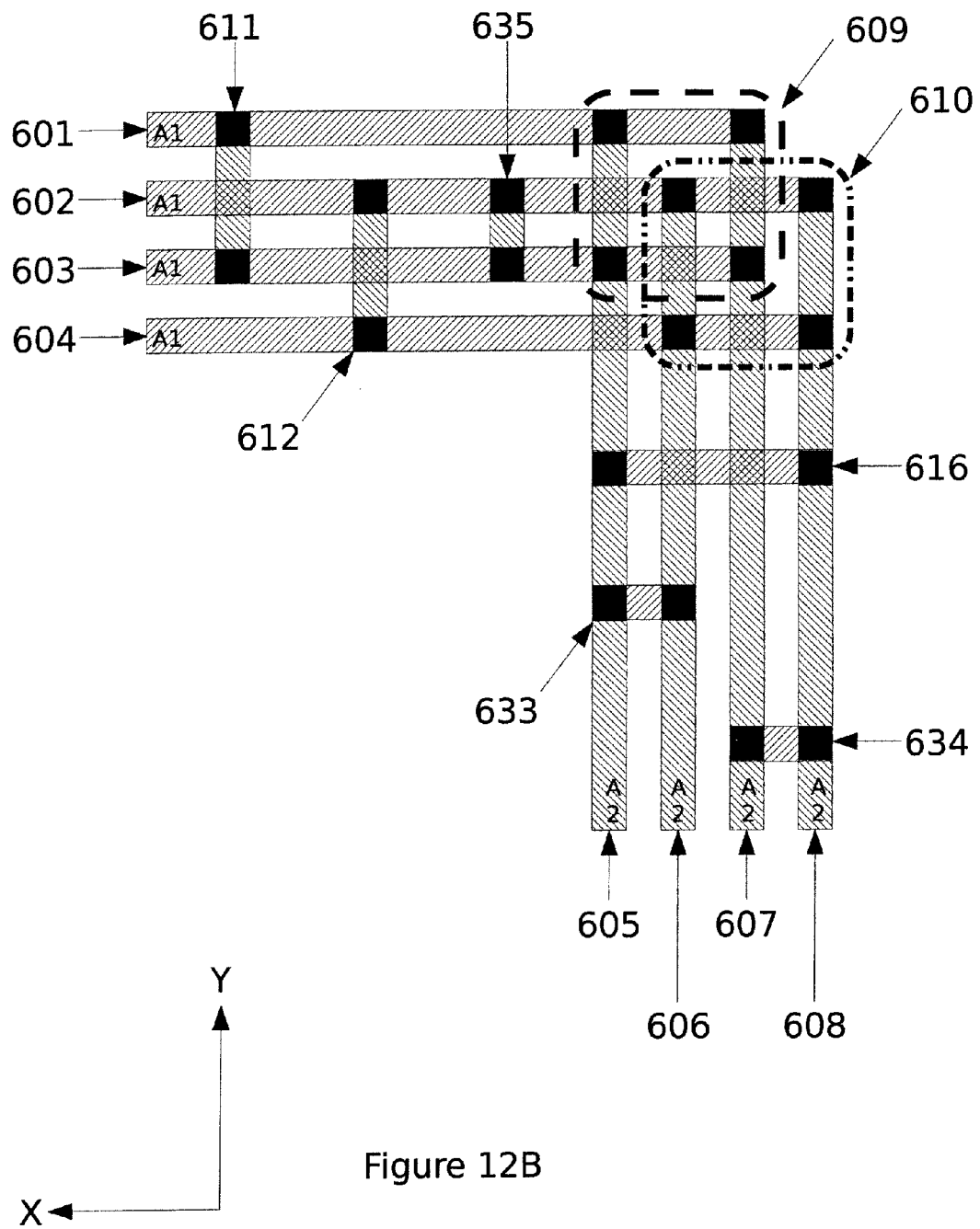
FIG. 12B shows a variation of the example layout of FIG. 12A in which OSt strap wires are used to connect adjacent and commonly oriented wires, in accordance with one embodiment of the present invention.

If orthogonally adjacent interlevel connector placement is permitted by the virtual grid, some or all of the OSt strap wires may be placed to connect adjacent and commonly oriented wires. FIG. 12B shows a variation of the example layout of FIG. 12A in which OSt strap wires are used to connect adjacent and commonly oriented wires. Specifically, a strap wire 635 is used to connect wires 602 and 603. Therefore, the combination of strap wires 611, 612, and 635 serves to connect the wires 601-604 of conductor channel A1. A strap wire 633 is used to connect wires 605 and 606. A strap wire 634 is used to connect wires 607 and 608. Therefore, the combination of strap wires 616, 633, and 634 serves to connect wires 605-608 of conductor channel A2.

Figure 12C:
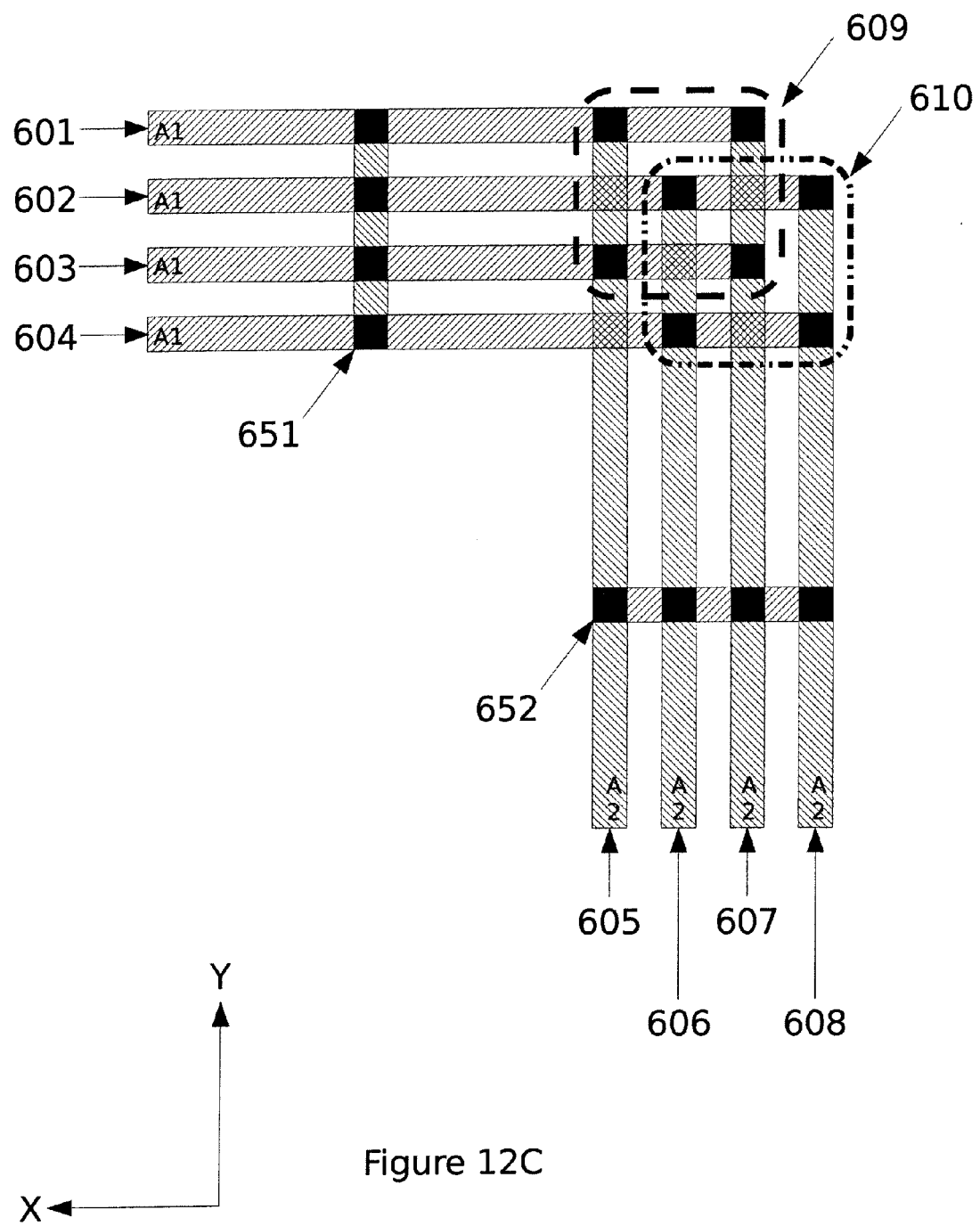
FIG. 12C shows a variation of the example layout of FIG. 12A in which each wire of a given conductor channel is connect by a single OSt strap wire, in accordance with one embodiment of the present invention.

FIG. 12C shows a variation of the example layout of FIG. 12A in which each wire of a given conductor channel is connect by a single OSt strap wire. Specifically, a strap wire 651 is defined to connect each of the wires 601-604 of conductor channel A1. Also, a strap wire 652 is defined to connect each of the wires 605-608 of conductor channel A2. Each of the strap wires 651 and 652 reinforces the connections of both RICAs 609 and 610.

Figure 13A:
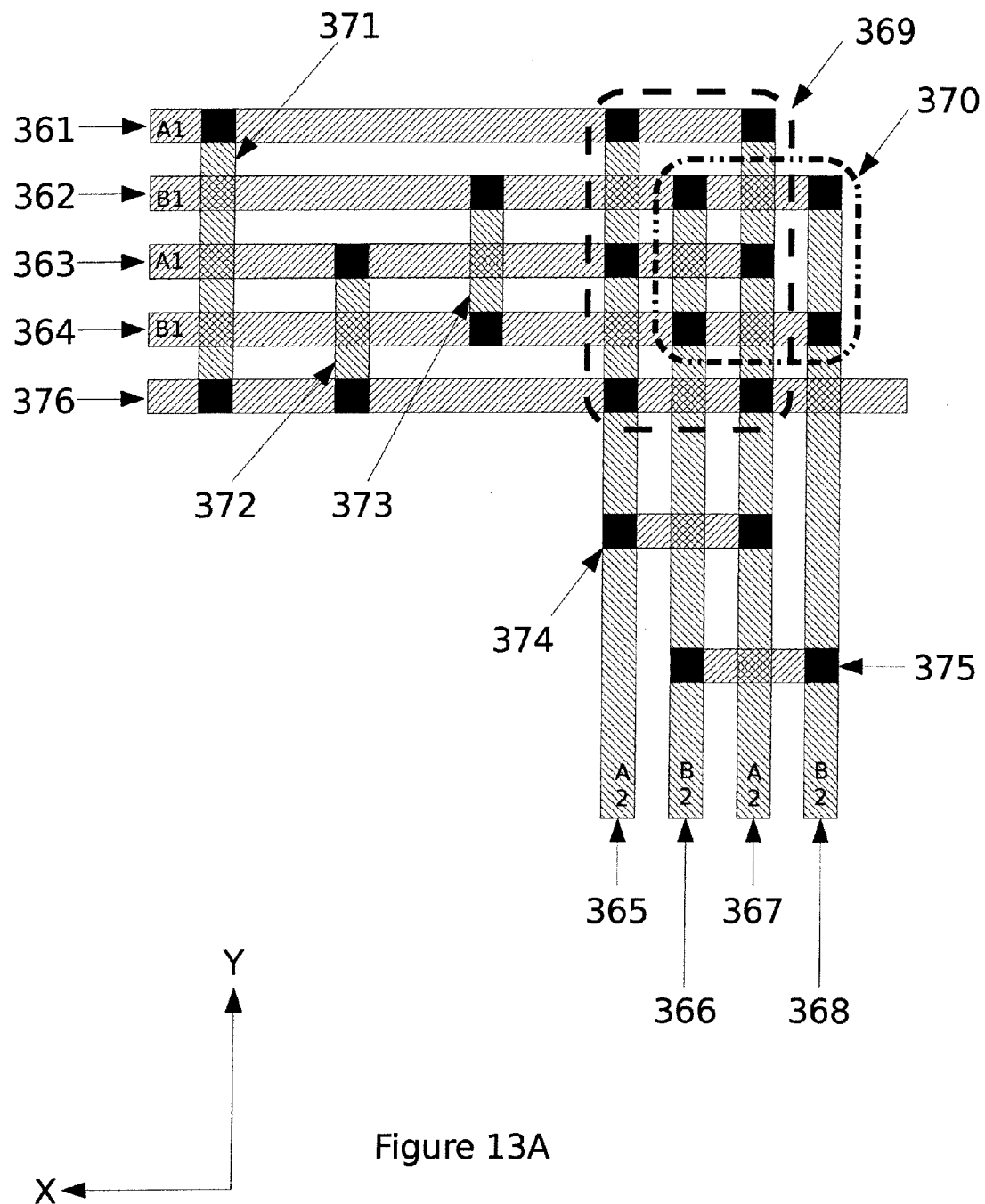
FIG. 13A shows an example layout in which an unused fill wire is incorporated into a conductor channel by way of OSt strap wires, in accordance with one embodiment of the present invention.

If one or more unused fill wires is routed near or adjacent to a conductor channel, OSt strap wires may be used to incorporate the unused fill wire into the conductor channel, as shown in the example of FIG. 13A. Wires 361 and 363 of horizontal conductor channel A1 are connected to unused fill wire 376 by OSt strap wires 371 and 372, respectively. Also, if the unused fill wire runs near or adjacent to a RICA to which its channel-by-incorporation is connected, the unused fill wire may be incorporated into the RICA. For example, in FIG. 13A, the unused fill wire 376 is extended into RICA 369. Therefore, RICA 369 is configured to connect conductor channel A1, as defined by wires 361, 363, and 376, to conductor channel A2 defined by wires 365 and 367. Incorporation of a fill wire into a conductor channel may serve to increase redundancy or alter the capacitance on conductor channel. Additionally, incorporation of a fill wire into a conductor channel may be used to increase the interlevel connector density in the areas around other interlevel connectors on the conductor channel.

Figure 13B:
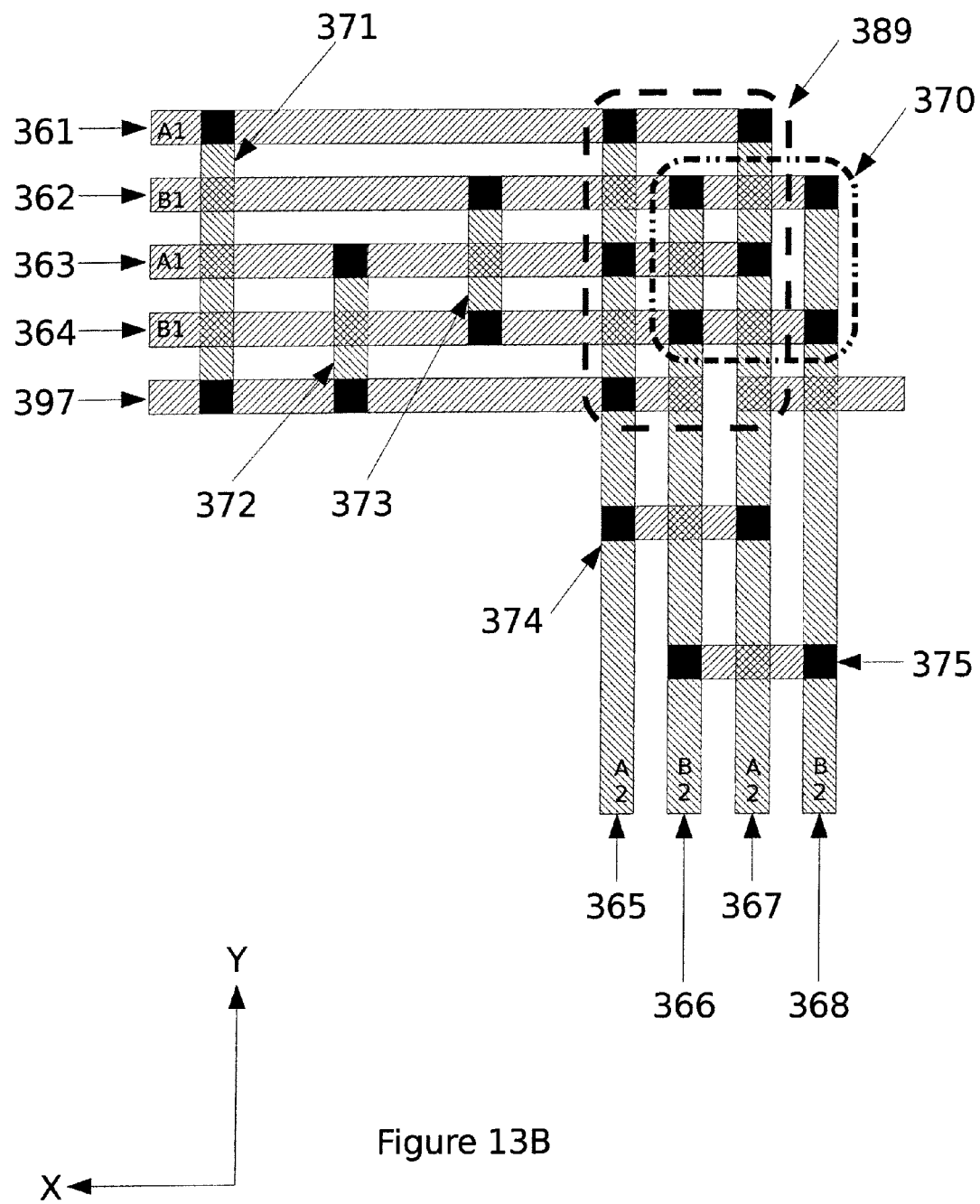
FIG. 13B shows the example layout of FIG. 13A with a shorter length fill wire, in accordance with one embodiment of the present invention.

It should be understood that the length of the fill wire does not need to be equal to or greater than the conductor channel segment to be incorporated into the conductor channel segment. For example, FIG. 13B shows the example layout of FIG. 13A with the fill wire 376 replaced by a shorter length fill wire 397. A fill wire may be partially incorporated into a RICA. For example, the fill wire 397 is partially incorporated into RICA 389.

Figure 14A:
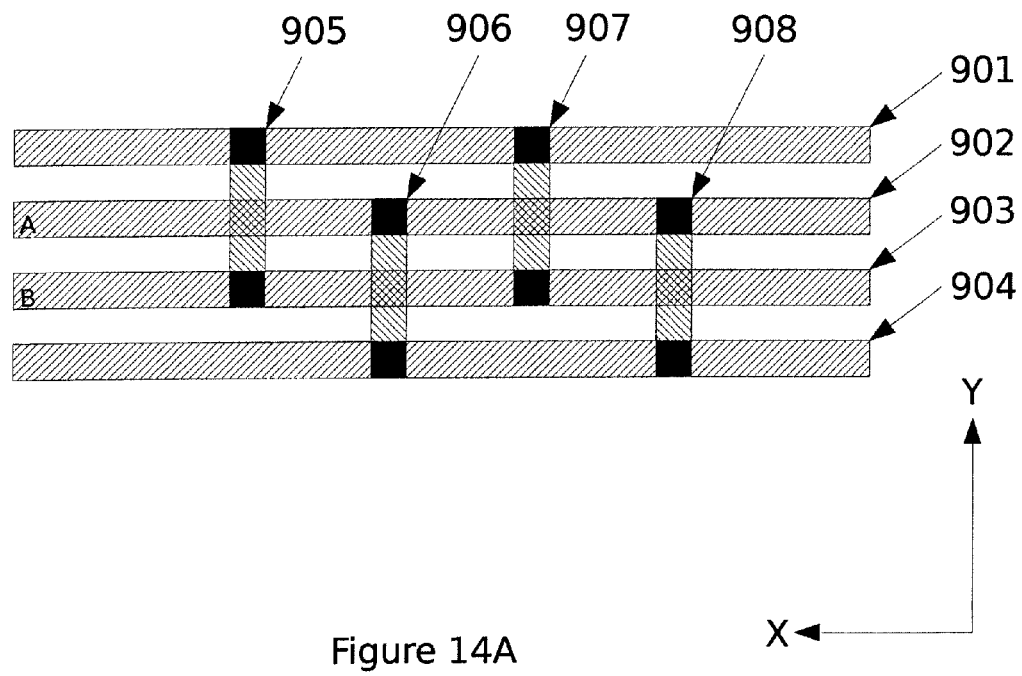
FIG. 14A shows an example layout demonstrating how OSt strap wires can connect to fill wires at any point along the length of the fill wires, in accordance with one embodiment of the present invention.
Figure 14B:
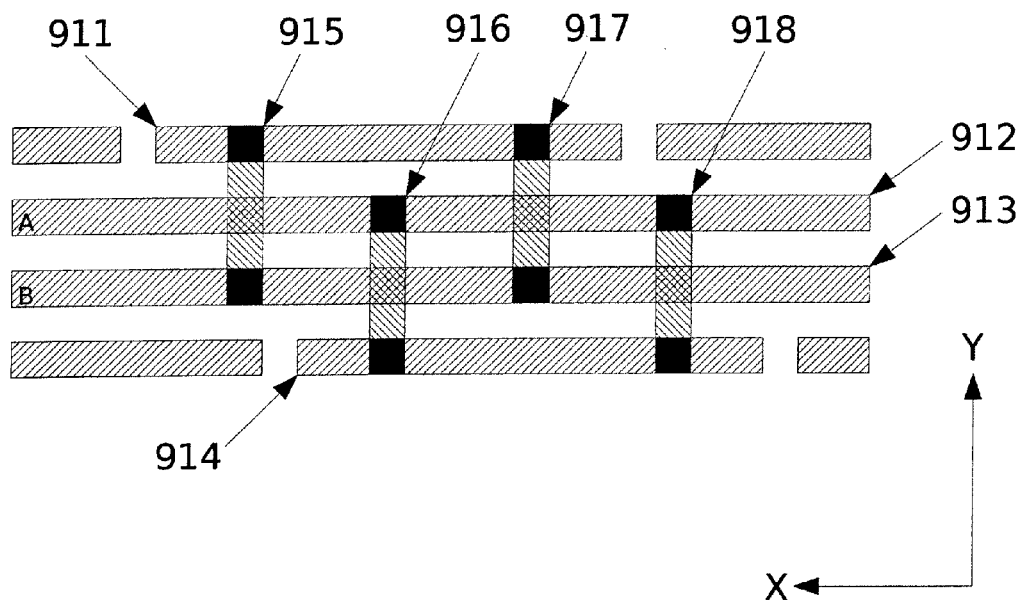
FIG. 14B shows an example layout demonstrating how shorter segments of fill wires may be connected to conductor channel wires, in accordance with one embodiment of the present invention.

Moreover, use of OSt strap wires to connect to nearby or adjacent conductor channel wires does not need to occur near a RICA. As shown in FIG. 14A, strap wires can be used to connect to fill wires at any point along the length of the fill wires. Fill wire 901 is connected to conductor channel wire 903 by OSt strap wires 905 and 907. Fill wire 904 is connected to conductor channel wire 902 by OSt strap wires 906 and 908. Again, OSt strap wire connection to fill wire can be used to increase redundancy, capacitance or interlevel connector density. Also, shorter segments of fill wires may be connected to conductor channel wires as shown in FIG. 14B. Fill wires 911 and 914 have a shorter length than conductor channel wires 912 and 913. Fill wire 911 is connected to conductor channel wire 913 by OSt strap wires 915 and 917. Fill wire 914 is connected to conductor channel wire 912 by OSt strap wires 916 and 918. It should be understood that OSt strap wires can be used to connect conductor channel wires to fill wires of any length.

Figure 14C:
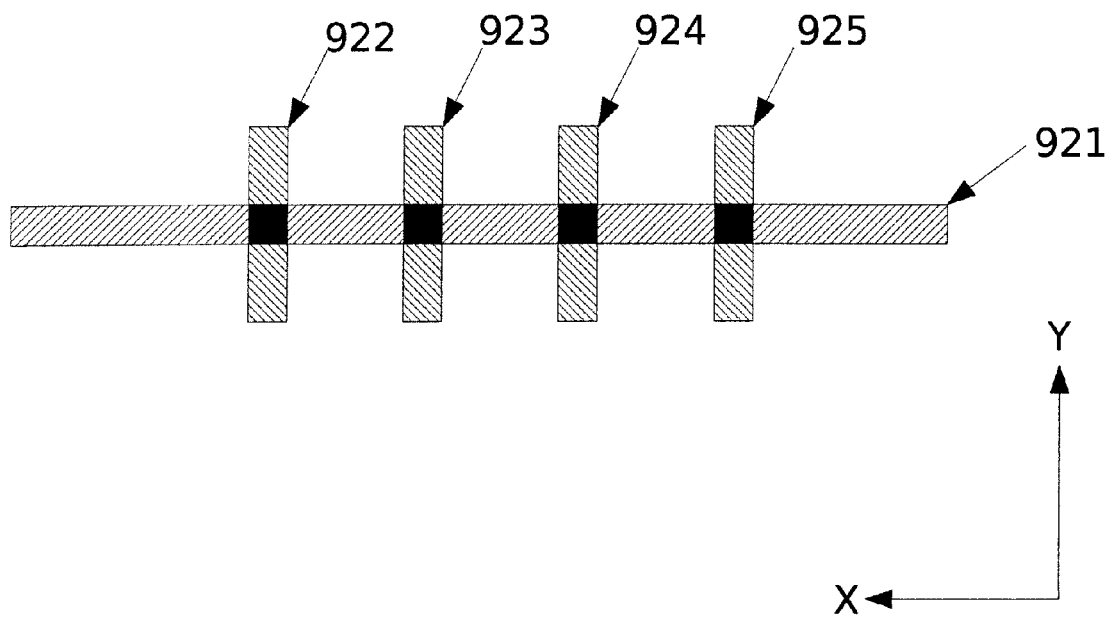
FIG. 14C shows an example layout demonstrating how tuning wires can be used to increase the capacitance on a channel wire or other wire, or to increase interlevel connector density in an area, in accordance with one embodiment of the present invention.

To increase the capacitance on a channel wire, or any single wire for that matter, or to increase interlevel connector density in an area, one or more tuning wires can be perpendicular connected along the run length of the subject wire, even in the case that these perpendicular tuning wires do not connect to an additional conductor channel or fill wire, as shown in FIG. 14C. For example, perpendicular tuning wires 922-925 are connected to wire 921. The frequency of these perpendicular tuning wires may be specified on a per wire basis, within a local area or globally. The perpendicular tuning wires do not need to be equally spaced along the length of the subject wire to which they are connected. Also, a minimum and maximum length may be specified for each perpendicular tuning wire. Also, a total length of all perpendicular tuning wires connected to a subject wire may be specified. The extension of a given perpendicular tuning wire beyond the interlevel connector to which it is connected can be defined independently from the extension of other perpendicular tuning wires, OSt wires, or channel wires.

Based on the foregoing, it should be understood that multiple RICAs can be overlapped to maintain an inner-to-outer sequence of conductor channel wires when a horizontal conductor channel transitions to a vertical conductor channel, vice-versa. Also, a RICA can be expanded to route any number of conductor channels. Also, a RICA can be expanded to connect any number of wires per conductor channel. Moreover, horizontal and vertical conductor channels defined by different numbers of wires can be connected through use of a RICA. Each extension of a wire with regard to an interlevel connector, e.g., via or contact, may be defined in a unique manner. Also, each extension of a wire may be defined as either negative, substantially zero, or positive with respect to an edge position of an interlevel connector.

Also, as discussed above, OSt strap wires can be used with RICAs or with any other type of interlevel connector pattern. OSt strap wires can be placed at essentially any location along the run length of a conductor channel. In one embodiment, OSt strap wires can be used to connect all wires in a multi-wire conductor channel. Also, in one embodiment, OSt strap wires can be used to connect to nearby fill wires.

Figure 16:
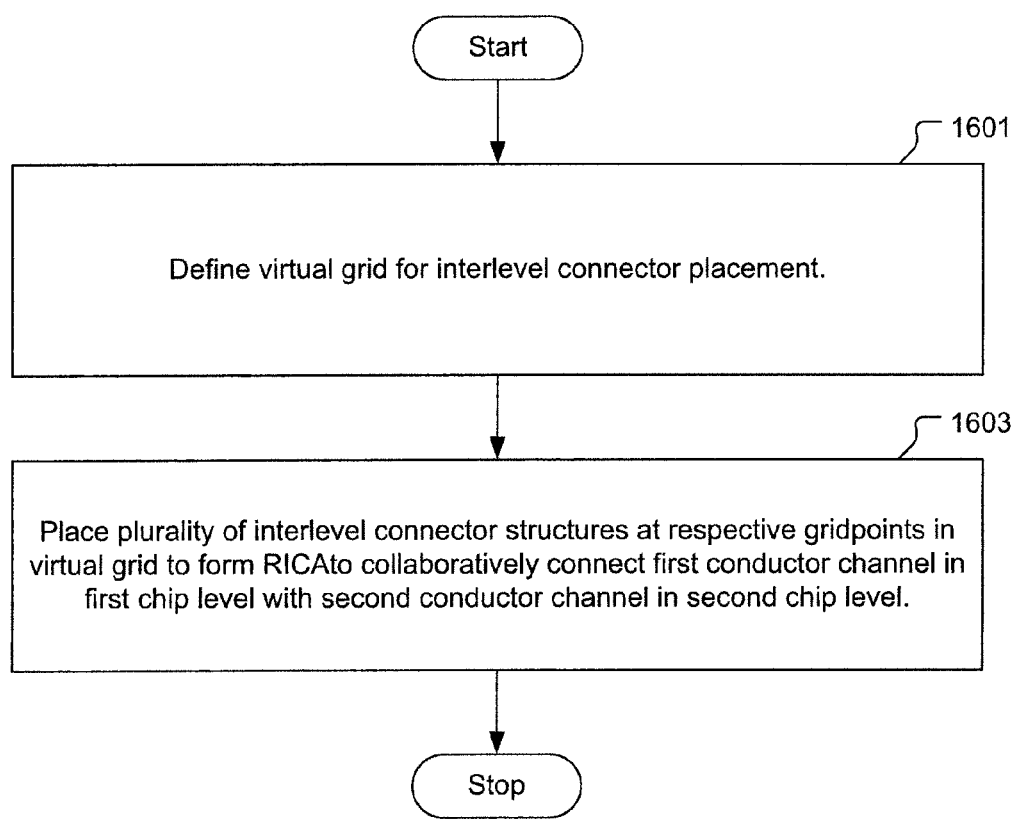
FIG. 16 shows a flowchart of a method for defining a RICA in a semiconductor chip layout, in accordance with one embodiment of the present invention.

FIG. 16 shows a flowchart of a method for defining a RICA in a semiconductor chip layout, in accordance with one embodiment of the present invention. The method includes an operation 1601 for defining a virtual grid for interlevel connector placement. The virtual grid is defined by a first set of parallel virtual lines that extend across the layout in a first direction, and by a second set of parallel virtual lines that extend across the layout in a second direction that is perpendicular to the first direction. Each intersection point between the first and second sets of parallel virtual lines is a gridpoint in the virtual grid.

The method also includes an operation 1603 for placing a first plurality of interlevel connector structures at respective gridpoints in the virtual grid to form a first RICA. In various embodiments, each interlevel connector structure is defined as either a via structure or a contact structure. Neighboring interlevel connector structures of the first RICA are spaced apart from each other by a first number of gridpoints in the first direction and by a second number of gridpoints in the second direction. Also, the first plurality of interlevel connector structures of the first RICA are placed to collaboratively connect a first conductor channel in a first chip level with a second conductor channel in a second chip level. The first conductor channel is defined by a first plurality of wires which are electrically equivalent to a single conductor. The second conductor channel is defined by a second plurality of wires which are electrically equivalent to a single conductor.

In one embodiment, the first plurality of wires of the first conductor channel are defined as parallel wires that extend in the first direction in the first chip level, and the second plurality of wires of the second conductor channel are defined as parallel wires that extend in the second direction in the second chip level, such that the first and second conductor channels are perpendicular to each other. In another embodiment, the first plurality of wires of the first conductor channel are defined as parallel wires that extend in the first direction in the first chip level, and the second plurality of wires of the second conductor channel are defined as parallel wires that also extend in the first direction in the second chip level, such that the first and second conductor channels extend in the same direction.

In one embodiment, the spacing between neighboring interlevel connectors is equal to one gridpoint of the virtual grid in the first direction, and one gridpoint of the virtual grid in the second direction. In another embodiment, the spacing between neighboring interlevel connectors is equal to one gridpoint of the virtual grid in the first direction, and at least two gridpoints of the virtual grid in the second direction. In yet another embodiment, the spacing between neighboring interlevel connectors is equal to at least two gridpoints in each of the first and second directions.

In one embodiment in which the interlevel connectors of the first RICA are spaced apart by at least two gridpoints of the virtual grid in each of the first and second directions, a non-RICA interlevel connector structure is placed at a gridpoint within the first RICA, so as to connect a first single wire with a second single wire. The first and second single wires are respectively defined in any different two levels of the chip. Each of the first and second single wires is not part of either the first or second conductor channel.

In one embodiment, the method includes an operation for placing a second plurality of interlevel connector structures at respective gridpoints in the virtual grid to form a second RICA that is interleaved with the first RICA. In this embodiment, the interlevel connector structures of the second RICA are placed to collaboratively connect a third conductor channel with a fourth conductor channel. The third and fourth conductor channels are respectively defined in any different two levels of the chip. In one version of this embodiment, the interlevel connectors of the first RICA are spaced apart by at least two gridpoints of the virtual grid in each of the first and second directions, and some of the second plurality of interlevel connector structures of the second RICA are placed at respective gridpoints between some of the first plurality of interlevel connector structures of the first RICA.

In one embodiment, the method includes an operation for placing a second plurality of interlevel connector structures at respective gridpoints in the virtual grid to form a second RICA that is embedded within the first RICA. Also in this embodiment, the interlevel connector structures of the second RICA are placed to collaboratively connect a third conductor channel with a fourth conductor channel. The third and fourth conductor channels are respectively defined in any different two levels of the chip. In this embodiment, the interlevel connectors of the first RICA are sufficiently spaced apart such that the first plurality of interlevel connector structures of the first RICA brackets the second plurality of interlevel connector structures of the second RICA in both the first and second directions.

In one embodiment, the method of FIG. 16 can optionally include an operation for defining a first number of strap wires to electrically connect some of the first plurality of wires of the first conductor channel together at a location outside the first RICA. Each of the first number of strap wires is defined in any level of the chip other than the first level, and each of the first number of strap wires is oriented perpendicular to the first plurality of wires of the first conductor channel. Each connection between the first number of strap wires and the first plurality of wires of the first conductor channel is formed by an interlevel connector structure.

Additionally, in this embodiment, another operation can be optionally performed to define a second number of strap wires to electrically connect some of the second plurality of wires of the second conductor channel together at a location outside the first RICA. Each of the second number of strap wires is defined in any level of the chip other than the first level, and each of the second number of strap wires is oriented perpendicular to the second plurality of wires of the second conductor channel. Also, each connection between the second number of strap wires and the second plurality of wires of the second conductor channel is formed by an interlevel connector structure.

Figure 17:
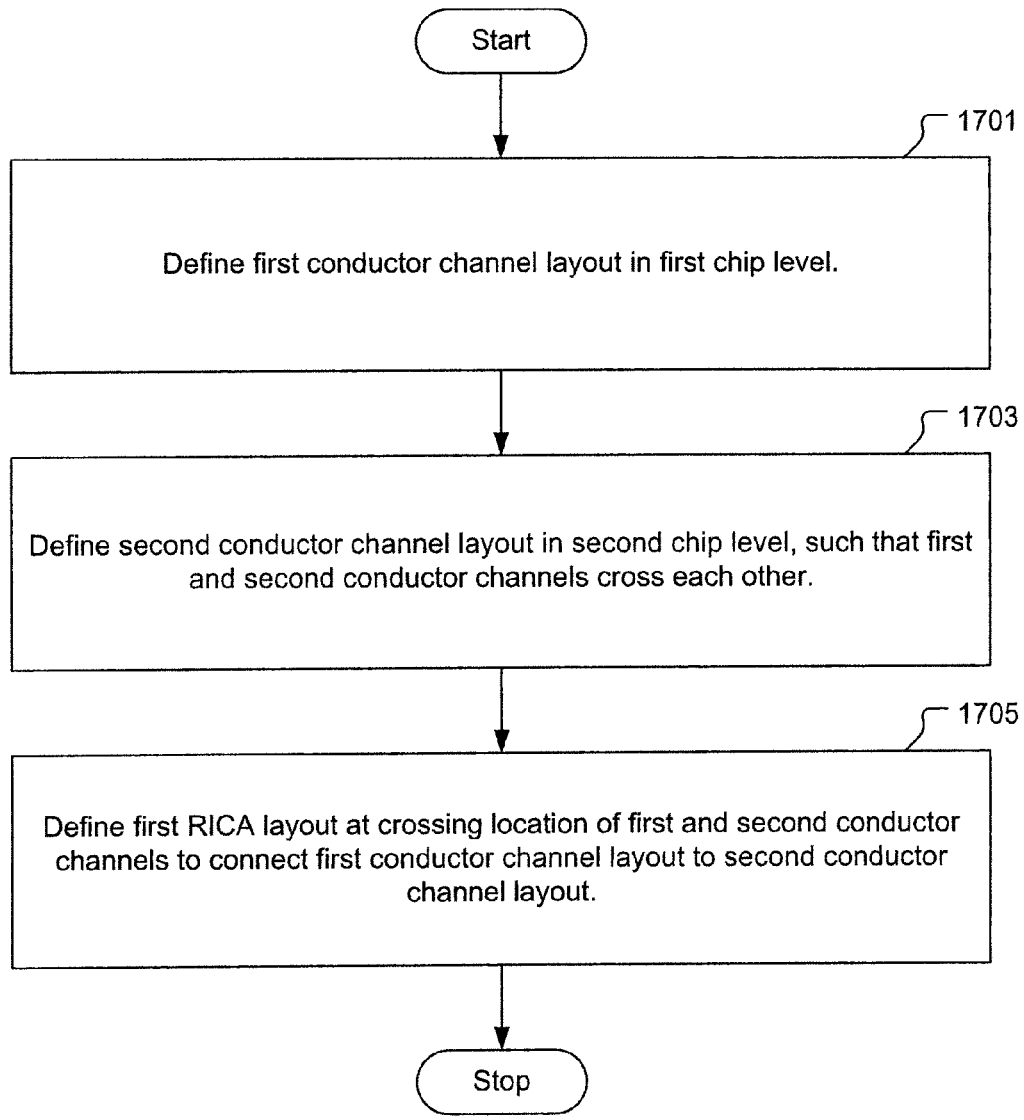
FIG. 17 shows a flowchart of a method for wire routing in a semiconductor chip layout, in accordance with one embodiment of the present invention.

FIG. 17 shows a flowchart of a method for wire routing in a semiconductor chip layout, in accordance with one embodiment of the present invention. The method includes an operation 1701 for defining a first conductor channel layout in a first chip level. The first conductor channel layout includes a first plurality of parallel wire layout shapes having a common electrical connectivity and oriented in a first direction. The method also includes an operation 1703 for defining a second conductor channel layout in a second chip level. The second conductor channel layout includes a second plurality of parallel wire layout shapes having a common electrical connectivity and oriented in a second direction that is perpendicular to the first direction. The first and second conductor channel layouts extend across each other within the chip layout at a crossing location.

The method further includes an operation 1705 for defining a first RICA layout at the crossing location to connect the first conductor channel layout to the second conductor channel layout. The first RICA layout includes a first plurality of interlevel connector layout shapes placed to collaboratively connect the wire layout shapes of the first conductor channel layout to the wire layout shapes of the second conductor channel layout. In one embodiment, the operation 1705 includes placing the first plurality of interlevel connector layout shapes at respective gridpoints in a virtual grid for interlevel connector placement. The virtual grid is defined by a first set of parallel virtual lines that extend across the chip layout in the first direction and by a second set of parallel virtual lines that extend across the chip layout in the second direction. Each intersection point between the first and second sets of parallel virtual lines is a gridpoint in the virtual grid for interlevel connector placement.

It should be understood that the methods as described herein and the resulting cell layouts can be stored in a tangible form, such as in a digital format on a computer readable medium. Also, the invention described herein can be embodied as computer readable code on a computer readable medium. The computer readable medium is any data storage device that can store data which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network of coupled computer systems so that the computer readable code is stored and executed in a distributed fashion.

Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

The embodiments of the present invention can also be defined as a machine that transforms data from one state to another state. The data may represent an article, that can be represented as an electronic signal and electronically manipulate data. The transformed data can, in some cases, be visually depicted on a display, representing the physical object that results from the transformation of data. The transformed data can be saved to storage generally, or in particular formats that enable the construction or depiction of a physical and tangible object. In some embodiments, the manipulation can be performed by a processor. In such an example, the processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A method for defining a rectangular interlevel connector array (RICA) in a semiconductor chip layout, comprising:

defining a virtual grid for interlevel connector placement, wherein the virtual grid is defined by a first set of parallel virtual lines that extend across the layout in a first direction and by a second set of parallel virtual lines that extend across the layout in a second direction that is perpendicular to the first direction, wherein each intersection point between the first and second sets of parallel virtual lines is a gridpoint in the virtual grid; and placing a first plurality of interlevel connector structures at respective gridpoints in the virtual grid to form a first RICA, whereby neighboring interlevel connector structures of the first RICA are spaced apart from each other by a first number of gridpoints in the first direction and by a second number of gridpoints in the second direction, and whereby the first plurality of interlevel connector structures of the first RICA are placed to collaboratively connect a first conductor channel in a first chip level with a second conductor channel in a second chip level.

2. The method as recited in claim 1, wherein the first conductor channel is defined by a first plurality of wires which are electrically equivalent to a single conductor, and wherein the second conductor channel is defined by a second plurality of wires which are electrically equivalent to a single conductor.

3. The method as recited in claim 2, wherein the first plurality of wires of the first conductor channel are defined as parallel wires that extend in the first direction in the first chip level, and wherein the second plurality of wires of the second conductor channel are defined as parallel wires that extend in the second direction in the second chip level.

4. The method as recited in claim 2, wherein the first plurality of wires of the first conductor channel are defined as parallel wires that extend in the first direction in the first chip level, and wherein the second plurality of wires of the second conductor channel are defined as parallel wires that also extend in the first direction in the second chip level.

5. The method as recited in claim 2, further comprising:

defining a first number of strap wires to electrically connect some of the first plurality of wires of the first conductor channel together at a location outside the first RICA, wherein each of the first number of strap wires is defined in any level of the chip other than the first level, and wherein each of the first number of strap wires is oriented perpendicular to the first plurality of wires of the first conductor channel, and wherein each connection between the first number of strap wires and the first plurality of wires of the first conductor channel is formed by an interlevel connector structure.

6. The method as recited in claim 5, further comprising:

defining a second number of strap wires to electrically connect some of the second plurality of wires of the second conductor channel together at a location outside the first RICA, wherein each of the second number of strap wires is defined in any level of the chip other than the second level, and wherein each of the second number of strap wires is oriented perpendicular to the second plurality of wires of the second conductor channel, and wherein each connection between the second number of strap wires and the second plurality of wires of the second conductor channel is formed by an interlevel connector structure.

7. The method as recited in claim 1, wherein the first number of gridpoints in the first direction is equal to one, and wherein the second number of gridpoints in the second direction is equal to one.

8. The method as recited in claim 1, wherein the first number of gridpoints in the first direction is equal to one, and wherein the second number of gridpoints in the second direction is equal to at least two.

9. The method as recited in claim 1, wherein the first number of gridpoints in the first direction is equal to at least two, and wherein the second number of gridpoints in the second direction is equal to at least two.

10. The method as recited in claim 9, wherein a non-RICA interlevel connector structure is placed at a gridpoint within the first RICA so as to connect a first single wire with a second single wire, wherein the first and second single wires are respectively defined in any different two levels of the chip, and wherein each of the first and second single wires is not part of either the first or second conductor channel.

11. The method as recited in claim 1, further comprising:

placing a second plurality of interlevel connector structures at respective gridpoints in the virtual grid to form a second RICA that is interleaved with the first RICA, whereby the interlevel connector structures of the second RICA are placed to collaboratively connect a third conductor channel with a fourth conductor channel, wherein the third and fourth conductor channels are respectively defined in any different two levels of the chip.

12. The method as recited in claim 11, wherein the first number of gridpoints in the first direction is equal to at least two, and wherein the second number of gridpoints in the second direction is equal to at least two, and wherein some of the second plurality of interlevel connector structures of the second RICA are placed at respective gridpoints between some of the first plurality of interlevel connector structures of the first RICA.

13. The method as recited in claim 1, placing a second plurality of interlevel connector structures at respective gridpoints in the virtual grid to form a second RICA that is embedded within the first RICA, whereby the interlevel connector structures of the second RICA are placed to collaboratively connect a third conductor channel with a fourth conductor channel, wherein the third and fourth conductor channels are respectively defined in any different two levels of the chip.

14. The method as recited in claim 13, wherein the first number of gridpoints in the first direction is set such that the first plurality of interlevel connector structures of the first RICA brackets the second plurality of interlevel connector structures of the second RICA in the first direction, and wherein the second number of gridpoints in the second direction is set such that the first plurality of interlevel connector structures of the first RICA brackets the second plurality of interlevel connector structures of the second RICA in the second direction.

15. The method as recited in claim 1, wherein each interlevel connector structure is defined as either a via structure or a contact structure.

16. A method for wire routing in a semiconductor chip layout, comprising:

defining a first conductor channel layout in a first chip level, wherein the first conductor channel layout includes a first plurality of parallel wire layout shapes having a common electrical connectivity and oriented in a first direction;

defining a second conductor channel layout in a second chip level, wherein the second conductor channel layout includes a second plurality of parallel wire layout shapes having a common electrical connectivity and oriented in a second direction that is perpendicular to the first direction, wherein the first and second conductor channel layouts extend across each other within the chip layout at a crossing location; and defining a first rectangular interlevel connector array (RICA) layout at the crossing location to connect the first conductor channel layout to the second conductor channel layout, wherein the first RICA layout includes a first plurality of interlevel connector layout shapes placed to collaboratively connect the wire layout shapes of the first conductor channel layout to the wire layout shapes of the second conductor channel layout.

17. The method as recited in claim 16, wherein defining the first RICA layout includes placing the first plurality of interlevel connector layout shapes at respective gridpoints in a virtual grid for interlevel connector placement, wherein the virtual grid is defined by a first set of parallel virtual lines that extend across the chip layout in the first direction and by a second set of parallel virtual lines that extend across the chip layout in the second direction, wherein each intersection point between the first and second sets of parallel virtual lines is a gridpoint in the virtual grid for interlevel connector placement, and wherein neighboring interlevel connector layout shapes of the first RICA layout are spaced apart from each other by a first number of gridpoints in the first direction and by a second number of gridpoints in the second direction.

18. The method as recited in claim 17, wherein the first number of gridpoints in the first direction is equal to one, and wherein the second number of gridpoints in the second direction is equal to one.

19. The method as recited in claim 17, wherein the first number of gridpoints in the first direction is equal to one, and wherein the second number of gridpoints in the second direction is equal to at least two.

20. The method as recited in claim 17, wherein the first number of gridpoints in the first direction is equal to at least two, and wherein the second number of gridpoints in the second direction is equal to at least two.

21. The method as recited in claim 20, wherein a non-RICA interlevel connector layout shape is placed at a gridpoint within the first RICA layout so as to connect a first single wire layout shape with a second single wire layout shape, wherein the first and second single wire layout shapes are respectively defined in any different two levels of the chip layout, and wherein each of the first and second single wire layout shapes is not part of either the first or second conductor channel.

22. The method as recited in claim 20, further comprising:
defining a third conductor channel layout and a fourth conductor channel layout, wherein the third and fourth conductor channel layouts are respectively defined in any different two levels of the chip layout; and placing a second plurality of interlevel connector layout shapes at respective gridpoints in the virtual grid to form a second RICA layout that is interleaved with the first RICA layout, whereby the interlevel connector layout shapes of the second RICA layout are placed to collaboratively connect the third conductor channel layout with the fourth conductor channel layout.

23. The method as recited in claim 22, wherein some of the second plurality of interlevel connector layout shapes of the second RICA layout are placed at respective gridpoints between some of the first plurality of interlevel connector layout shapes of the first RICA layout.

24. The method as recited in claim 20, further comprising:
defining a third conductor channel layout and a fourth conductor channel layout, wherein the third and fourth conductor channel layouts are respectively defined in any different two levels of the chip layout; and placing a second plurality of interlevel connector layout shapes at respective gridpoints in the virtual grid to form a second RICA layout that is embedded within the first RICA layout, whereby the interlevel connector layout shapes of the second RICA layout are placed to collaboratively connect the third conductor channel layout with the fourth conductor channel layout.

25. The method as recited in claim 24, wherein the first number of gridpoints in the first direction is set such that the first plurality of interlevel connector layout shapes of the first RICA layout brackets the second plurality of interlevel connector layout shapes of the second RICA layout in the first direction, and wherein the second number of gridpoints in the second direction is set such that the first plurality of interlevel connector layout shapes of the first RICA layout brackets the second plurality of interlevel connector layout shapes of the second RICA layout in the second direction.

26. The method as recited in claim 16, wherein each interlevel connector layout shape represents either a via structure or a contact structure.

27. The method as recited in claim 16, further comprising:
defining a first number of strap wire layout shapes to electrically connect some of the first plurality of wire layout shapes of the first conductor channel layout together at a location outside the first RICA layout, wherein each of the first number of strap wire layout shapes is defined in any level of the chip layout other than the first level, and wherein each of the first number of strap wire layout shapes is oriented perpendicular to the first plurality of wire layout shapes of the first conductor channel layout, and wherein each connection between the first number of strap wire layout shapes and the first plurality of wire layout shapes of the first conductor channel layout is formed by an interlevel connector layout shape.

28. The method as recited in claim 27, further comprising:
defining a second number of strap wire layout shapes to electrically connect some of the second plurality of wire layout shapes of the second conductor channel layout together at a location outside the first RICA layout, wherein each of the second number of strap wire layout shapes is defined in any level of the chip layout other than the second level, and wherein each of the second number of strap wire layout shapes is oriented perpendicular to the second plurality of wire layout shapes of the second conductor channel layout, and wherein each connection between the second number of strap wire layout shapes and the second plurality of wire layout shapes of the second conductor channel layout is formed by an interlevel connector layout shape.

* * * * *